US007777395B2

(12) United States Patent
Xu et al.

(10) Patent No.: US 7,777,395 B2
(45) Date of Patent: Aug. 17, 2010

(54) CONTINUOUS DROP EMITTER WITH REDUCED STIMULATION CROSSTALK

(75) Inventors: Jinquan Xu, Rochester, NY (US); Randolph C. Brost, Albuquerque, NM (US); Qing Yang, Pittsford, NY (US); Fernando Luis De Souza Lopes, Richmond (CA); Stephen F. Pond, Williamsburg, VA (US)

(73) Assignee: Eastman Kodak Company, Rochester, NY (US)

( * ) Notice: Subject to any disclaimer, the term of this patent is extended or adjusted under 35 U.S.C. 154(b) by 979 days.

(21) Appl. No.: 11/548,709

(22) Filed: Oct. 12, 2006

(65) Prior Publication Data

US 2008/0088680 A1 Apr. 17, 2008

(51) Int. Cl.
*H01L 41/00* (2006.01)
*B41J 2/02* (2006.01)

(52) U.S. Cl. ........................................ 310/326; 347/75

(58) Field of Classification Search .................. 347/75, 347/47, 94, 61, 74, 82, 54, 46, 10, 11; 310/326
See application file for complete search history.

(56) References Cited

U.S. PATENT DOCUMENTS

| | | | | |
|---|---|---|---|---|
| 3,373,437 | A | 3/1968 | Sweet et al. | 347/74 |
| 3,560,641 | A | 2/1971 | Taylor et al. | 358/296 |
| 3,596,275 | A | 7/1971 | Sweet | 65/493 |
| 3,739,393 | A | 6/1973 | Lyon et al. | 347/75 |
| 3,832,579 | A * | 8/1974 | Arndt | 310/326 |
| 3,877,036 | A | 4/1975 | Loeffler et al. | 347/77 |
| 3,878,519 | A | 4/1975 | Eaton | 347/75 |
| 4,146,899 | A * | 3/1979 | Paranjpe et al. | 347/47 |
| 4,220,958 | A | 9/1980 | Crowley | 347/75 |
| 4,528,571 | A * | 7/1985 | Sweet | 347/94 |
| 4,554,558 | A * | 11/1985 | Beaudet et al. | 347/75 |
| 4,638,328 | A | 1/1987 | Drake et al. | 347/75 |
| 4,958,168 | A * | 9/1990 | Culpepper | 347/75 |
| 5,224,843 | A | 7/1993 | van Lintel | 417/413.2 |
| 5,699,093 | A * | 12/1997 | Alderson | 347/61 |
| 6,382,753 | B1 * | 5/2002 | Teramae et al. | 347/10 |
| 6,382,754 | B1 * | 5/2002 | Morikoshi et al. | 347/11 |
| 6,387,225 | B1 | 5/2002 | Shimada et al. | 204/192.18 |
| 6,474,784 | B1 | 11/2002 | Fujii et al. | 347/54 |
| 6,474,794 | B1 * | 11/2002 | Anagnostopoulos et al. | 347/74 |

(Continued)

FOREIGN PATENT DOCUMENTS

| | | |
|---|---|---|
| EP | 1 308 278 | 5/2003 |

(Continued)

*Primary Examiner*—Stephen D Meier
*Assistant Examiner*—Carlos A Martinez, Jr.
(74) *Attorney, Agent, or Firm*—Stephen Pond Consulting

(57) ABSTRACT

A continuous drop emitter includes a liquid supply chamber containing a liquid held at a positive pressure. First and second nozzles are in fluid communication with the liquid supply chamber and emit first and second continuous streams of a liquid. First and second stream break-up transducers independently synchronize the break up of the first and second continuous streams of the liquid into first and second streams of drops. An acoustic damping material is located adjacent to or within the liquid supply chamber for damping sound waves generated within the liquid chamber by the first and second stream break-up transducer. The continuous drop emitter can be configured with a Helmholtz resonant chamber tuned to a critical stimulation frequency having an acoustic damping material located therein.

7 Claims, 15 Drawing Sheets

U.S. PATENT DOCUMENTS

| | | | | |
|---|---|---|---|---|
| 6,505,921 | B2 | 1/2003 | Chwalek et al. | 347/77 |
| 6,511,161 | B2 | 1/2003 | Sumi et al. | 347/68 |
| 6,543,107 | B1 | 4/2003 | Miyashita et al. | 29/25.35 |
| 6,561,627 | B2 | 5/2003 | Jarrold et al. | 347/54 |
| 6,799,821 | B1 * | 10/2004 | Okuda | 347/10 |
| 7,025,442 | B2 * | 4/2006 | Yaron | 347/54 |
| 2004/0095441 | A1 * | 5/2004 | Jeanmaire | 347/82 |
| 2007/0081027 | A1 * | 4/2007 | Beltran et al. | 347/46 |
| 2007/0291091 | A9 * | 12/2007 | Silverbrook | 347/94 |

FOREIGN PATENT DOCUMENTS

| | | |
|---|---|---|
| GB | 2275447 | 8/1994 |
| JP | 1-242261 | 9/1989 |

* cited by examiner

CONTINUOUS DROP EMITTER WITH REDUCED STIMULATION CROSSTALK

FIELD OF THE INVENTION

This invention relates generally to the field of digitally controlled printing and liquid patterning devices, and in particular to continuous ink jet systems in which a liquid stream breaks into drops, some of which are selectively deflected.

BACKGROUND OF THE INVENTION

Ink jet printing has become recognized as a prominent contender in the digitally controlled, electronic printing arena because of its non-impact, low-noise characteristics, its use of plain paper and its avoidance of toner transfer and fixing. Ink jet printing mechanisms can be categorized by technology as either drop-on-demand ink jet or continuous ink jet.

The first technology, "drop-on-demand" ink jet printing, provides ink droplets that impact upon a recording surface by using a pressurization actuator (thermal, piezoelectric, etc.). Many commonly practiced drop-on-demand technologies use thermal actuation to eject ink droplets from a nozzle. A heater, located at or near the nozzle, heats the ink sufficiently to boil, forming a vapor bubble that creates enough internal pressure to eject an ink droplet. This form of ink jet is commonly termed "thermal ink jet (TIJ)." Other known drop-on-demand droplet ejection mechanisms include piezoelectric actuators, such as that disclosed in U.S. Pat. No. 5,224,843, issued to van Lintel, on Jul. 6, 1993; thermo-mechanical actuators, such as those disclosed by Jarrold et al., U.S. Pat. No. 6,561,627, issued May 13, 2003; and electrostatic actuators, as described by Fujii et al., U.S. Pat. No. 6,474,784, issued Nov. 5, 2002.

The second technology, commonly referred to as "continuous" ink jet printing, uses a pressurized ink source that produces a continuous stream of ink droplets from a nozzle. The stream is perturbed in some fashion causing it to break up into substantially uniform sized drops at a nominally constant distance, the break-off length, from the nozzle. A charging electrode structure is positioned at the nominally constant break-off point so as to induce a data-dependent amount of electrical charge on the drop at the moment of break-off. The charged droplets are directed through a fixed electrostatic field region causing each droplet to deflect proportionately to its charge. The charge levels established at the break-off point thereby cause drops to travel to a specific location on a recording medium or to a gutter for collection and recirculation.

Continuous ink jet (CIJ) drop generators rely on the physics of an unconstrained fluid jet, first analyzed in two dimensions by F. R. S. (Lord) Rayleigh, "Instability of jets," Proc. London Math. Soc. 10 (4), published in 1878. Lord Rayleigh's analysis showed that liquid under pressure, P, will stream out of a hole, the nozzle, forming a jet of diameter, $d_j$, moving at a velocity, $v_j$. The jet diameter, $d_j$, is approximately equal to the effective nozzle diameter, $D_{dn}$, and the jet velocity is proportional to the square root of the reservoir pressure, P. Rayleigh's analysis showed that the jet will naturally break up into drops of varying sizes based on surface waves that have wavelengths, $\lambda$, longer than $\pi d_j$, i.e. $\lambda \geqq \pi d_j$. Rayleigh's analysis also showed that particular surface wavelengths would become dominate if initiated at a large enough magnitude, thereby "synchronizing" the jet to produce mono-sized drops. Continuous ink jet (CIJ) drop generators employ some periodic physical process, a so-called "perturbation" or "stimulation", that has the effect of establishing a particular, dominant surface wave on the jet. The surface wave grows causing the break-off of the jet into mono-sized drops synchronized to the frequency of the perturbation.

The drop stream that results from applying Rayleigh stimulation will be referred to herein as a stream of drops of predetermined volume as distinguished from the naturally occurring stream of drops of widely varying volume. While in prior art CIJ systems, the drops of interest for printing or patterned layer deposition were invariably of substantially unitary volume, it will be explained that for the present inventions, the stimulation signal may be manipulated to produce drops of predetermined substantial multiples of the unitary volume. Hence the phrase, "streams of drops of predetermined volumes" is inclusive of drop streams that are broken up into drops all having nominally one size or streams broken up into drops of selected (predetermined) different volumes.

In a CIJ system, some drops, usually termed "satellites" much smaller in volume than the predetermined unit volume, may be formed as the stream necks down into a fine ligament of fluid. Such satellites may not be totally predictable or may not always merge with another drop in a predictable fashion, thereby slightly altering the volume of drops intended for printing or patterning. The presence of small, unpredictable satellite drops is, however, inconsequential to the present inventions and is not considered to obviate the fact that the drop sizes have been predetermined by the synchronizing energy signals used in the present inventions. Thus the phrase "predetermined volume" as used to describe the present inventions should be understood to comprehend that some small variation in drop volume about a planned target value may occur due to unpredictable satellite drop formation.

Commercially practiced CIJ printheads use a piezoelectric device, acoustically coupled to the printhead, to initiate a dominant surface wave on the jet. The coupled piezoelectric device superimposes periodic pressure variations on the base reservoir pressure, causing velocity or flow perturbations that in turn launch synchronizing surface waves. A pioneering disclosure of a piezoelectrically-stimulated CIJ apparatus was made by R. Sweet in U.S. Pat. No. 3,596,275, issued Jul. 27, 1971, Sweet '275 hereinafter. The CIJ apparatus disclosed by Sweet '275 consisted of a single jet, i.e. a single drop generation liquid chamber and a single nozzle structure.

Sweet '275 disclosed several approaches to providing the needed periodic perturbation to the jet to synchronize drop break-off to the perturbation frequency. Sweet '275 discloses a magnetostrictive material affixed to a capillary nozzle enclosed by an electrical coil that is electrically driven at the desired drop generation frequency, vibrating the nozzle, thereby introducing a dominant surface wave perturbation to the jet via the jet velocity. Sweet '275 also discloses a thin ring-electrode positioned to surround but not touch the unbroken fluid jet, just downstream of the nozzle. If the jetted fluid is conductive, and a periodic electric field is applied between the fluid filament and the ring-electrode, the fluid jet may be caused to expand periodically, thereby directly introducing a surface wave perturbation that can synchronize the jet break-off. This CIJ technique is commonly called electrohydrodynamic (EHD) stimulation.

Sweet '275 further disclosed several techniques for applying a synchronizing perturbation by superimposing a pressure variation on the base liquid reservoir pressure that forms the jet. Sweet '275 disclosed a pressurized fluid chamber, the drop generator chamber, having a wall that can be vibrated mechanically at the desired stimulation frequency. Mechanical vibration means disclosed included use of magnetostrictive or piezoelectric transducer drivers or an electromagnetic moving coil. Such mechanical vibration methods are often termed "acoustic stimulation" in the CIJ literature.

The several CIJ stimulation approaches disclosed by Sweet '275 may all be practical in the context of a single jet system However, the selection of a practical stimulation mechanism for a CIJ system having many jets is far more complex. A pioneering disclosure of a multi-jet CIJ printhead has been made by Sweet et al. in U.S. Pat. No. 3,373,437, issued Mar. 12, 1968, Sweet '437 hereinafter. Sweet '437 discloses a CIJ printhead having a common drop generator chamber that communicates with a row (an array) of drop emitting nozzles. A rear wall of the common drop generator chamber is vibrated by means of a magnetostrictive device, thereby modulating the chamber pressure and causing a jet velocity perturbation on every jet of the array of jets.

Since the pioneering CIJ disclosures of Sweet '275 and Sweet '437, most disclosed multi-jet CIJ printheads have employed some variation of the jet break-off perturbation means described therein. For example, U.S. Pat. No. 3,560, 641 issued Feb. 2, 1971 to Taylor et al. discloses a CIJ printing apparatus having multiple, multi-jet arrays wherein the drop break-off stimulation is introduced by means of a vibration device affixed to a high pressure ink supply line that supplies the multiple CIJ printheads. U.S. Pat. No. 3,739,393 issued Jun. 12, 1973 to Lyon et al. discloses a multi-jet CIJ array wherein the multiple nozzles are formed as orifices in a single thin nozzle plate and the drop break-off perturbation is provided by vibrating the nozzle plate, an approach akin to the single nozzle vibrator disclosed by Sweet '275. U.S. Pat. No. 3,877,036 issued Apr. 8, 1975 to Loeffler et al. discloses a multi-jet CIJ printhead wherein a piezoelectric transducer is bonded to an internal wall of a common drop generator chamber, a combination of the stimulation concepts disclosed by Sweet '437 and '275

Unfortunately, all of the stimulation methods employing a vibration of some component of the printhead structure or a modulation of the common supply pressure result in some amount of non-uniformity of the magnitude of the perturbation applied to each individual jet of a multi-jet CIJ array. Non-uniform stimulation leads to a variability in the break-off length and timing among the jets of the array. This variability in break-off characteristics, in turn, leads to an inability to position a common drop charging assembly or to use a data timing scheme that can serve all of the jets of the array.

In addition to addressing problems of break-off time control among jets of an array, continuous drop emission systems that generate drops of different predetermined volume based on liquid pattern data need a means of stimulating each individual jet in an independent fashion in response to the liquid pattern data. Consequently, in recent years an effort has been made to develop practical "stimulation per jet" apparatus capable of applying individual stimulation signals to individual jets. As will be discussed hereinbelow, plural stimulation element apparatus have been successfully developed, however, some inter jet stimulation "crosstalk" problems may remain.

The electrohydrodynamic (EHD) jet stimulation concept disclosed by Sweet '275 operates on the emitted liquid jet filament directly, causing minimal acoustic excitation of the printhead structure itself, thereby avoiding the above noted confounding contributions of printhead and mounting structure resonances. U.S. Pat. No. 4,220,958 issued Sep. 2, 1980 to Crowley discloses a CIJ printer wherein the perturbation is accomplished by an EHD exciter composed of pump electrodes of a length equal to about one-half the droplet spacing. The multiple pump electrodes are spaced at intervals of multiples of about one-half the droplet spacing or wavelength downstream from the nozzles. This arrangement greatly reduces the voltage needed to achieve drop break-off over the configuration disclosed by Sweet '275.

While EHD stimulation has been pursued as an alternative to acoustic stimulation, it has not been applied commercially because of the difficulty in fabricating printhead structures having the very close jet-to-electrode spacing and alignment required and, then, operating reliably without electrostatic breakdown occurring. Also, due to the relatively long range of electric field effects, EHD is not amenable to providing individual stimulation signals to individual jets in an array of closely spaced jets.

An alternate jet perturbation concept that overcomes all of the drawbacks of acoustic or EHD stimulation was disclosed for a single jet CIJ system in U.S. Pat. No. 3,878,519 issued Apr. 15, 1975 to J. Eaton (Eaton hereinafter). Eaton discloses the thermal stimulation of a jet fluid filament by means of localized light energy or by means of a resistive heater located at the nozzle, the point of formation of the fluid jet. Eaton explains that the fluid properties, especially the surface tension, of a heated portion of a jet may be sufficiently changed with respect to an unheated portion to cause a localized change in the diameter of the jet, thereby launching a dominant surface wave if applied at an appropriate frequency. U.S. Pat. No. 4,638,328 issued Jan. 20, 1987 to Drake, et al. (Drake hereinafter) discloses a thermally-stimulated multi-jet CIJ drop generator fabricated in an analogous fashion to a thermal ink jet device. That is, Drake discloses the operation of a traditional thermal ink jet (TIJ) edgeshooter or roofshooter device in CIJ mode by supplying high pressure ink and applying energy pulses to the heaters sufficient to cause synchronized break-off but not so as to generate vapor bubbles.

Also recently, microelectromechanical systems (MEMS), have been disclosed that utilize electromechanical and thermomechanical transducers to generate mechanical energy for performing work. For example, thin film piezoelectric, ferroelectric or electrostrictive materials such as lead zirconate titanate (PZT), lead lanthanum zirconate titanate (PLZT), or lead magnesium niobate titanate (PMNT) may be deposited by sputtering or sol gel techniques to serve as a layer that will expand or contract in response to an applied electric field. See, for example Shimada, et al. in U.S. Pat. No. 6,387,225, issued May 14, 2002; Sumi, et al., in U.S. Pat. No. 6,511,161, issued Jan. 28, 2003; and Miyashita, et al., in U.S. Pat. No. 6,543,107, issued Apr. 8, 2003. Thermomechanical devices utilizing electroresistive materials that have large coefficients of thermal expansion, such as titanium aluminide, have been disclosed as thermal actuators constructed on semiconductor substrates. See, for example, Jarrold et al., U.S. Pat. No. 6,561,627, issued May 13, 2003. Therefore electromechanical devices may also be configured and fabricated using microelectronic processes to provide stimulation energy on a jet-by-jet basis.

U.S. Pat. No. 6,505,921 issued to Chwalek, et al. on Jan. 14, 2003, discloses a method and apparatus whereby a plurality of thermally deflected liquid streams is caused to break up into drops of large and small volumes, hence, large and small cross-sectional areas (Chwalek '921 hereinafter). Thermal deflection is used to cause smaller drops to be directed out of the plane of the plurality of streams of drops while large drops are allowed to fly along nominal "straight" pathways. In addition, a uniform gas flow is imposed in a direction having velocity components perpendicular and across the array of streams of drops of cross-sectional areas. The perpendicular gas flow velocity components apply more force per mass to drops having smaller cross-sections than to drops having larger cross-sections, resulting in an amplification of the deflection acceleration of the small drops.

Continuous drop emission systems that utilize stimulation per jet apparatus are effective in providing control of the break-up parameters of an individual jet within a large array of jets. The inventors of the present inventions have found, however, that even when the stimulation is highly localized to each jet, for example, via resistive heating at the nozzle exit of each jet, some stimulation crosstalk still propagates as acoustic energy through the liquid via the common supply chambers. The added acoustic stimulation crosstalk from adjacent jets may adversely affect jet break up in terms of break-off timing or satellite drop formation. When operating in a printing mode of generating different predetermined drop volumes, according to the liquid pattern data, acoustic stimulation crosstalk may alter the jet break-up producing drops that are not the desired predetermined volume. Especially in the case of systems using multiple predetermined drop volumes, the effects of acoustic stimulation cross talk are data-dependent, leading to complex interactions that are difficult to predict. Consequently, there is a need to improve the stimulation per jet type of continuous liquid drop emitter by reducing inter-jet acoustic stimulation crosstalk so that the break-up characteristics of individual jets are predictable, and may be relied upon in translating liquid pattern data into drop generation pulse sequences for the plurality of jets in a large array of continuous drop emitters.

SUMMARY OF THE INVENTION

The foregoing and numerous other features, objects and advantages of the present invention will become readily apparent upon a review of the detailed description, claims and drawings set forth herein. These features, objects and advantages are accomplished by constructing a continuous drop emitter comprising a liquid supply chamber containing a liquid held at a positive pressure and first and second nozzles in fluid communication with the liquid supply chamber nozzles emitting first and second continuous streams of a liquid. The continuous drop emitter is further comprised of first and second stream break-up transducers adapted to independently synchronize the break up of the first and second continuous streams of the liquid into first and second streams of drops of predetermined volumes, respectively. An acoustic damping material located adjacent to or within the liquid supply chamber for damping sound waves generated within the liquid chamber by the first and second stream break-up transducer is provided to reduce stimulation crosstalk arising in the liquid supplying the first nozzle from the second stream break-up transducer and vice versa.

The present inventions may also be configured with a Helmholtz resonant chamber tuned to a selected acoustic crosstalk frequency and having an acoustic damping material therein for absorbing acoustic stimulation energy. The Helmholtz resonant chamber may serve as a portion of the common liquid supply for the first and second jets in which case the acoustic damping material may be porous to allow the liquid to pass through.

The present inventions are additionally comprised of acoustic damping materials that absorb acoustic energy by means of coupling to acoustically lossy materials.

The present inventions are further comprised of porous acoustic damping materials that absorb acoustic energy by means forcing the liquid through small passages causing viscous flow energy losses.

The present inventions also comprise acoustic damping materials that cause the disruption of acoustic waves by reflection from materials that are impedance mismatched to the liquid, either dense materials or gas filled voids.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the detailed description of the preferred embodiments of the invention presented below, reference is made to the accompanying drawings, in which.

DETAILED DESCRIPTION OF THE INVENTION

The present description will be directed in particular to elements forming part of, or cooperating more directly with, apparatus in accordance with the present invention. Functional elements and features have been given the same numerical labels in the figures if they are the same element or perform the same function for purposes of understanding the present inventions. It is to be understood that elements not specifically shown or described may take various forms well known to those skilled in the art.

Figure 1:
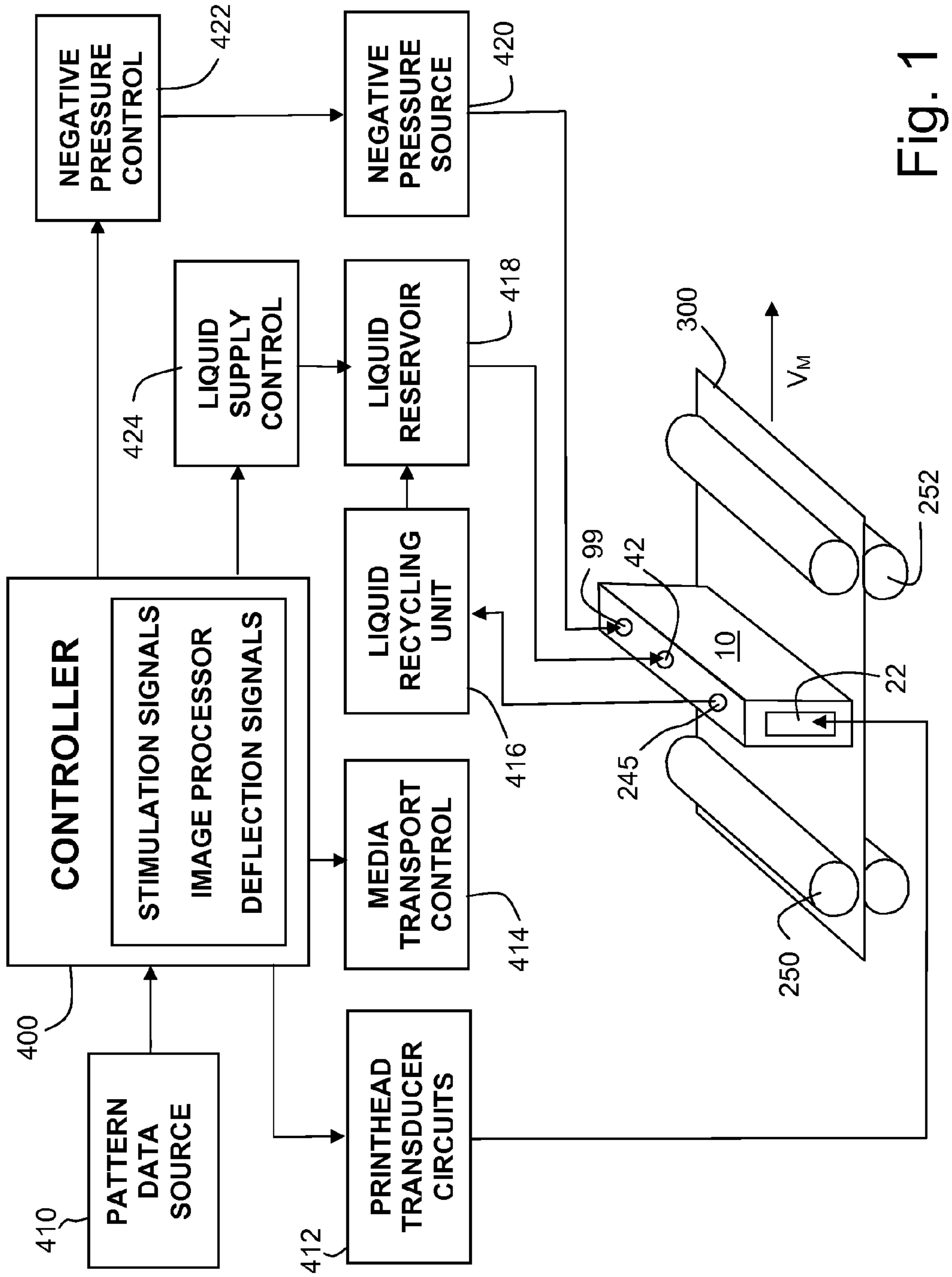
FIG. 1 shows a simplified block schematic diagram of one exemplary liquid pattern deposition apparatus made in accordance with the present invention.

Referring to FIG. 1, a continuous drop emission system for depositing a liquid pattern is illustrated. Typically such systems are ink jet printers and the liquid pattern is an image printed on a receiver sheet or web. However, other liquid patterns may be deposited by the system illustrated including, for example, masking and chemical initiator layers for manufacturing processes. For the purposes of understanding the present inventions the terms “liquid” and “ink” will be used interchangeably, recognizing that inks are typically associated with image printing, a subset of the potential applications of the present inventions. The liquid pattern deposition system is controlled by a process controller 400 that interfaces with various input and output components, computes necessary translations of data and executes needed programs and algorithms.

The liquid pattern deposition system further includes a source of the image or liquid pattern data 410 which provides raster image data, outline image data in the form of a page description language, or other forms of digital image data. This image data is converted to bitmap image data by controller 400 and stored for transfer to a multi-jet drop emission printhead 10 via a plurality of printhead transducer circuits 412 connected to printhead electrical interface 20. The bit map image data specifies the deposition of individual drops onto the picture elements (pixels) of a two dimensional matrix of positions, equally spaced a pattern raster distance, determined by the desired pattern resolution, i.e. the pattern “dots per inch” or the like. The raster distance or spacing may be equal or may be different in the two dimensions of the pattern.

Controller 400 also creates drop synchronization signals to the printhead transducer circuits that are subsequently applied to printhead 10 to cause the break-up of the plurality of fluid streams emitted into drops of predetermined volume and with a predictable timing. Printhead 10 is illustrated as a “page wide” printhead in that it contains a plurality of jets sufficient to print all scanlines across the medium 300 without need for movement of the printhead itself.

Recording medium 300 is moved relative to printhead 10 by a recording medium transport system, which is electronically controlled by a media transport control system 414, and which in turn is controlled by controller 400. The recording medium transport system shown in FIG. 1 is a schematic representation only; many different mechanical configurations are possible. For example, input transfer roller 250 and output transfer roller 252 could be used in a recording medium transport system to facilitate transfer of the liquid drops to recording medium 300. Such transfer roller technology is well known in the art. In the case of page width printheads as illustrated in FIG. 1, it is most convenient to move recording medium 300 past a stationary printhead. Recording medium 300 is transported at a velocity, $V_M$. In the case of scanning print systems, it is usually most convenient to move the printhead along one axis (the sub-scanning direction) and the recording medium along an orthogonal axis (the main scanning direction) in a relative raster motion. The present inventions are equally applicable to printing systems having moving or stationary printheads and moving or stationary receiving media, and all combinations thereof.

Pattern liquid is contained in a liquid reservoir 418 under pressure. In the non-printing state, continuous drop streams are unable to reach recording medium 300 due to a fluid gutter (not shown) that captures the stream and which may allow a portion of the liquid to be recycled by a liquid recycling unit 416. The liquid recycling unit 416 receives the un-printed liquid via printhead fluid outlet 245, reconditions the liquid and feeds it back to reservoir 418 or stores it. The liquid recycling unit may also be configured to apply a vacuum pressure to printhead fluid outlet 245 to assist in liquid recovery and to affect the gas flow through printhead 10. Such liquid recycling units are well known in the art. The liquid pressure suitable for optimal operation will depend on a number of factors, including geometry and thermal properties of the nozzles and thermal properties of the liquid. A constant liquid pressure can be achieved by applying pressure to liquid reservoir 418 under the control of liquid supply controller 424 that is managed by controller 400.

The liquid is distributed via a liquid supply line entering printhead 10 at liquid inlet port 42. The liquid preferably flows through slots and/or holes etched through a silicon substrate of printhead 10 to its front surface, where a plurality of nozzles and printhead transducers are situated. In some preferred embodiments of the present inventions the printhead transducers are resistive heaters. In other embodiments, more than one transducer per jet may be provided including some combination of resistive heaters, electric field electrodes and microelectromechanical flow valves. When printhead 10 is at least partially fabricated from silicon, it is possible to integrate some portion of the printhead transducer control circuits 412 with the printhead, simplifying printhead electrical connector 22.

A secondary drop deflection apparatus, described in more detail below, maybe configured downstream of the liquid drop emission nozzles. This secondary drop deflection apparatus comprises an airflow plenum that generates air flows that impinge individual drops in the plurality of streams of drops flying along predetermined paths based on pattern data. A negative pressure source 420, controlled by the controller 400 through a negative pressure control apparatus 422, is connected to printhead 10 via negative pressure source inlet 99.

Figure 2A:
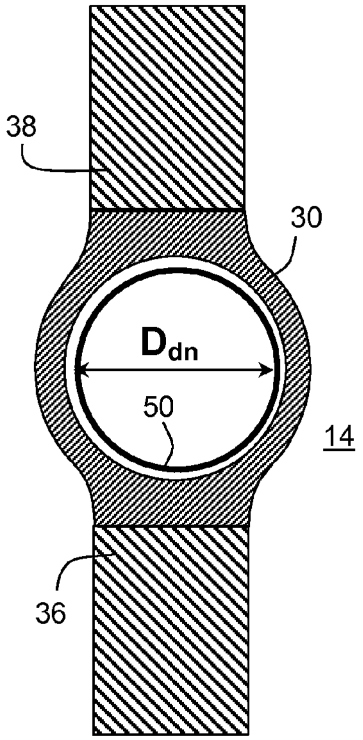
FIGS. 2(*a*) and 2(*b*) show schematic cross-sections illustrating natural break-up and synchronized break-up, respectively, of continuous steams of liquid into drops, respectively.
Figure 2B:
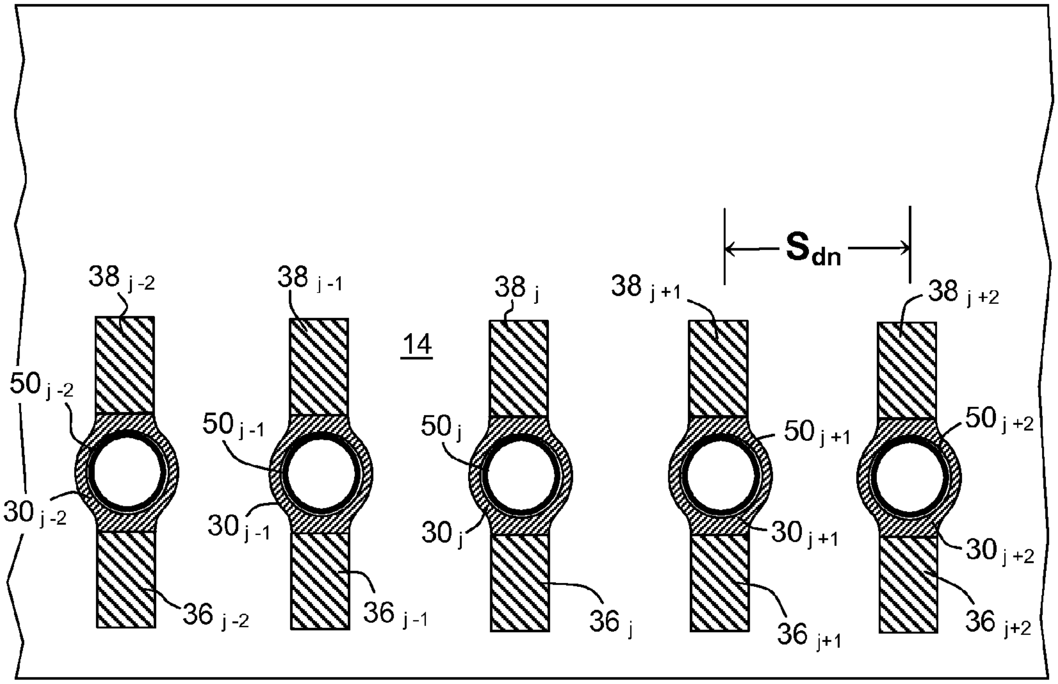

A front face view of a single nozzle 50 of a preferred printhead embodiment is illustrated in FIG. 2(*a*). A portion of an array of such nozzles is illustrated in FIG. 2(*b*). For simplicity of understanding, when multiple jets and component elements are illustrated, suffixes “j”, “j+1”, et cetera, are used to denote the same functional elements, in order, along a large array of such elements. FIGS. 2(*a*) and 2(*b*) show nozzles 50 of a drop generator portion of printhead 10 having a circular shape with a diameter, $D_{dn}$, equally spaced at a drop nozzle spacing, $S_{dn}$, along a nozzle array direction or axis, and formed in a nozzle layer 14. While a circular nozzle is depicted, other shapes for the liquid emission orifice may be used and an effective diameter expressed, i.e., the circular diameter that specifies an equivalent open area. Typically the nozzle diameter will be formed in the range of 8 microns to 35 microns, depending on the size of drops that are appropriate for the liquid pattern being deposited. Typically the drop nozzle spacing will be in the range 84 to 21 microns corresponding to a pattern raster resolution in the nozzle axis direction of 300 pixels/inch to 1200 pixels/inch.

An encompassing resistive heater 30 is formed on a front face layer surrounding the nozzle bore. Resistive heater 30 is addressed by electrodes 38 and 36. One of these electrodes 36 may be shared in common with the resistors surrounding other jets. At least one resistor lead 38, however, provides electrical pulses to the jet individually so as to cause the independent stimulation of that jet. Alternatively a matrix addressing arrangement may be employed in which the two address leads 38, 36 are used in conjunction to selectively apply stimulation pulses to a given jet. These same resistive heaters are also utilized to launch a surface wave of the proper wavelength to synchronize the jet of liquid to break-up into drops of substantially uniform diameter, $D_d$, volume, $V_0$, and spacing $\lambda_d$. Pulsing schemes may also be devised that cause the break-up of the stream into segments of fluid that coalesce into drops having volumes, $V_m$, that are approximately integer multiples of $V_0$, i.e. into drops of volume ~$mV_0$, where m is an integer.

Figure 3A:
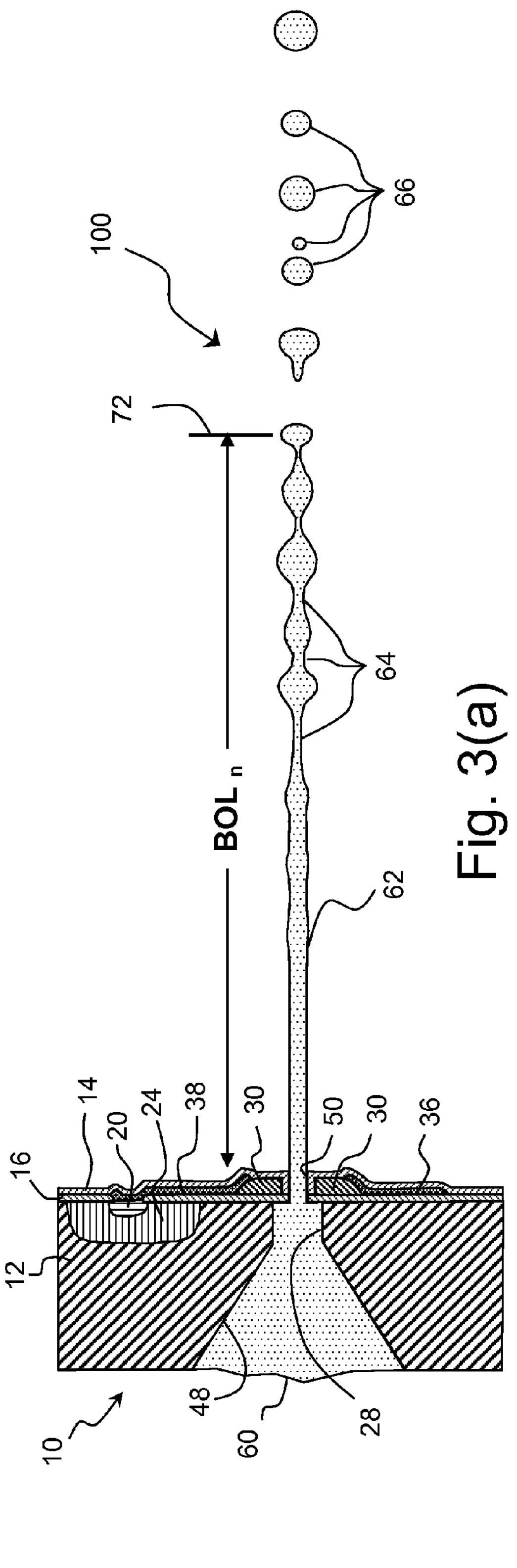
FIGS. 3(*a*) and 3(*b*) show schematic plan views of a single thermal stream break-up transducer and a portion of an array of such transducers, respectively, according to a preferred embodiment of the present invention.
Figure 3B:
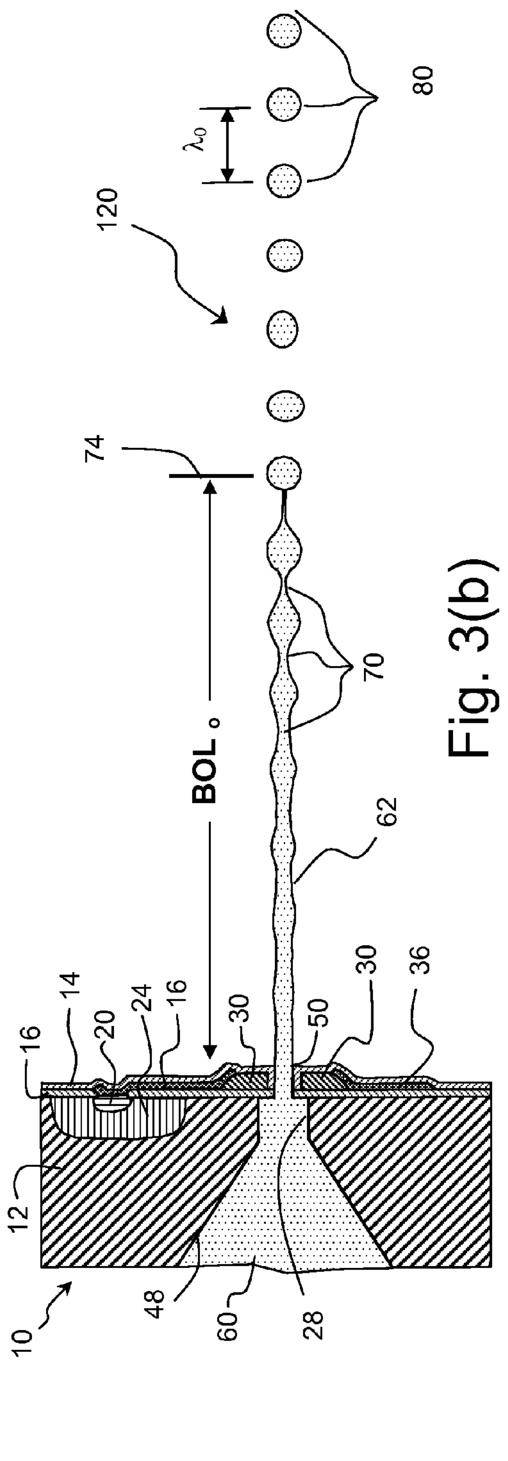

One effect of pulsing nozzle heater 30 on a continuous stream of fluid 62 is illustrated in a side view in FIGS. 3(*a*) and 3(*b*). FIGS. 3(*a*) and 3(*b*) illustrate a portion of a drop generator substrate 12 around one nozzle 50 of the plurality of nozzles. Pressurized fluid 60 is supplied to nozzle 50 via proximate liquid supply chamber 48. Nozzle 50 is formed in drop nozzle front face layer 14, and possibly in thermal and electrical isolation layer 16.

In FIG. 3(*a*) nozzle heater 30 is not energized. Continuous fluid stream 62 forms natural sinuate surface necking 64 of varying spacing resulting in an unsynchronized break-up at location 77 into a stream 100 of drops 66 of widely varying diameter and volume. The natural break-off length, $BOL_n$, is defined as the distance from the nozzle face to the point where drops detach from the continuous column of fluid. For this case of natural, unsynchronized break-up, the break-off length, $BOL_n$, is not well defined and varies considerably with time.

In FIG. 3(*b*) nozzle heater 30 is pulsed with energy pulses sufficient to launch a dominant surface wave causing dominate surface sinuate necking 70 on the fluid column 62, leading to the synchronization of break-up into a stream 120 of drops 80 of substantially uniform diameter, $D_d$, and spacing, $\lambda_0$, and at a stable operating break-off point 76 located an operating distance, $BOL_o$, from the nozzle plane. The fluid streams and individual drops 66 and 80 in FIGS. 3(*a*) and 3(*b*) travel along a nominal flight path at a velocity of $V_d$, based on the fluid pressurization magnitude, nozzle geometry and fluid properties.

Figure 4A:
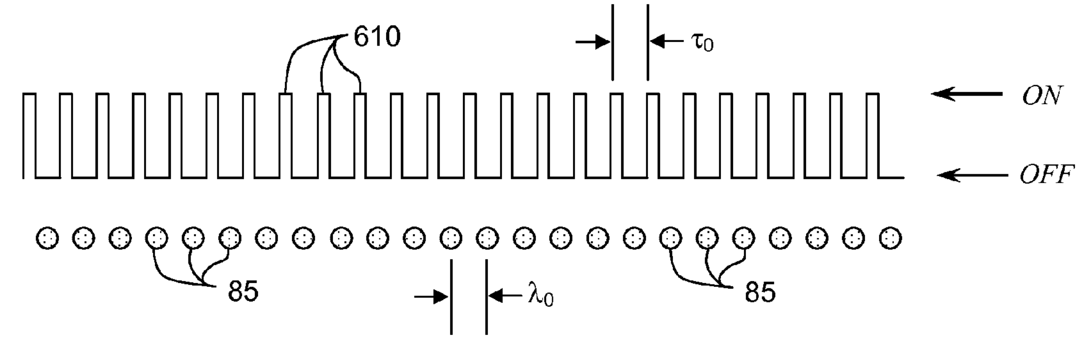
FIGS. 4(*a*), 4(*b*) and 4(*c*) show representations of energy pulse sequences for stimulating synchronous break-up of a fluid jet by stream break-up heater resistors resulting in drops of different predetermined volumes according to a preferred embodiment of the present inventions.
Figure 4B:
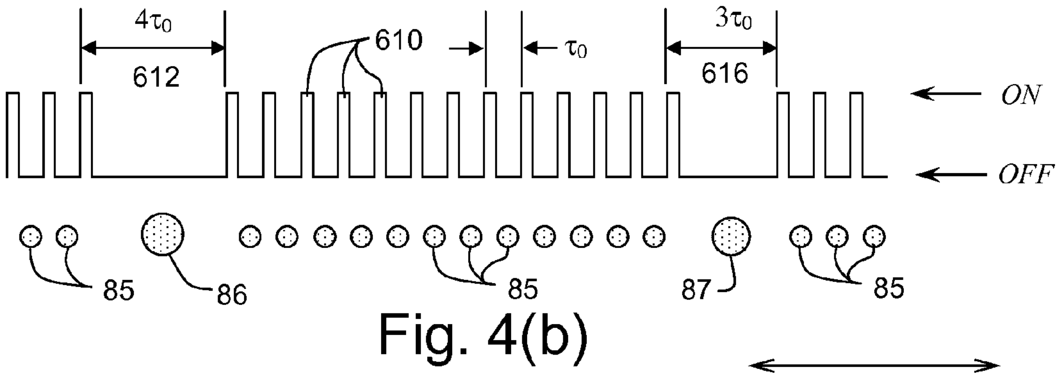
Figure 4C:
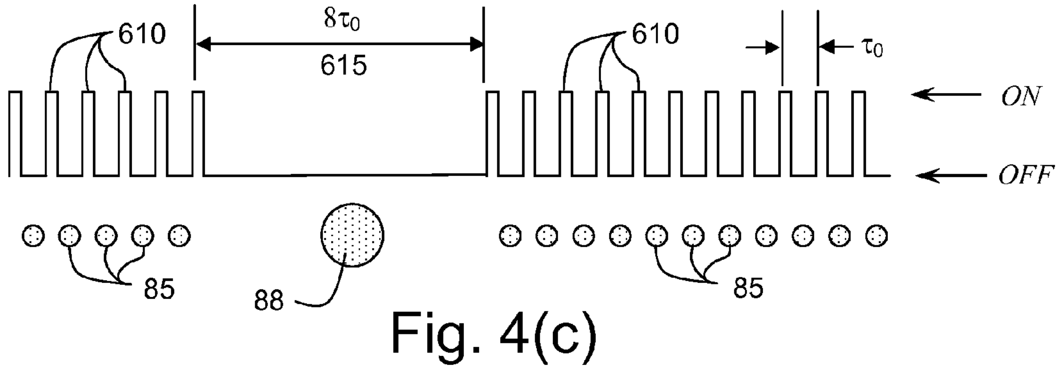

Thermal pulse synchronization of the break-up of continuous liquid jets is also known to provide the capability of generating streams of drops of predetermined volumes wherein some drops may be formed having approximate integer, m, multiple volumes, $mV_0$, of a unit volume, $V_0$. See for example U.S. Pat. No. 6,588,888 to Jeanmaire, et al. and assigned to the assignee of the present inventions. FIGS. 4(*a*)-4(*c*) illustrate thermal stimulation of a continuous stream by several different sequences of electrical energy pulses. The energy pulse sequences are represented schematically as turning a heater resistor "on" and "off" to create a stimulation energy pulse during unit periods, $\tau_0$.

In FIG. 4(*a*) the stimulation pulse sequence consists of a train of unit period pulses 610. A continuous jet stream stimulated by this pulse train is caused to break up into drops 85 all of volume $V_0$, spaced in time by $\tau_0$ and spaced along their flight path by $\lambda_0$. The energy pulse train illustrated in FIG. 4(*b*) consists of unit period pulses 610 plus the deletion of some pulses creating a $4\tau_0$ time period for sub-sequence 612 and a $3\tau_0$ time period for sub-sequence 616. The deletion of stimulation pulses causes the fluid in the jet to collect (coalesce) into drops of volumes consistent with these longer than unit time periods. That is, sub-sequence 612 results in the break-off of a drop 86 having coalesced volume of approximately $4V_0$ and sub-sequence 616 results in a drop 87 of coalesced volume of approximately $3V_0$. FIG. 4(*c*) illustrates a pulse train having a sub-sequence of period $8\tau_0$ generating a drop 88 of coalesced volume of approximately $8V_0$. Coalescence of the multiple units of fluid into a single drop requires some travel distance and time from the break-off point. The coalesced drop tends to be located near the center of the space that would have been occupied had the fluid been broken into multiple individual drops of nominal volume $V_0$.

The capability of producing drops in substantially multiple units of the unit volume $V_0$ may be used to advantage in differentiating between print and non-printing drops. Drops may be deflected by entraining them in a cross air flow field. Larger drops have a smaller drag to mass ratio and so are deflected less than smaller volume drops in an air flow field. Thus an air deflection zone may be used to disperse drops of different volumes to different flight paths. A liquid pattern deposition system may be configured to print with large volume drops and to gutter small drops, or vice versa.

Figure 5:
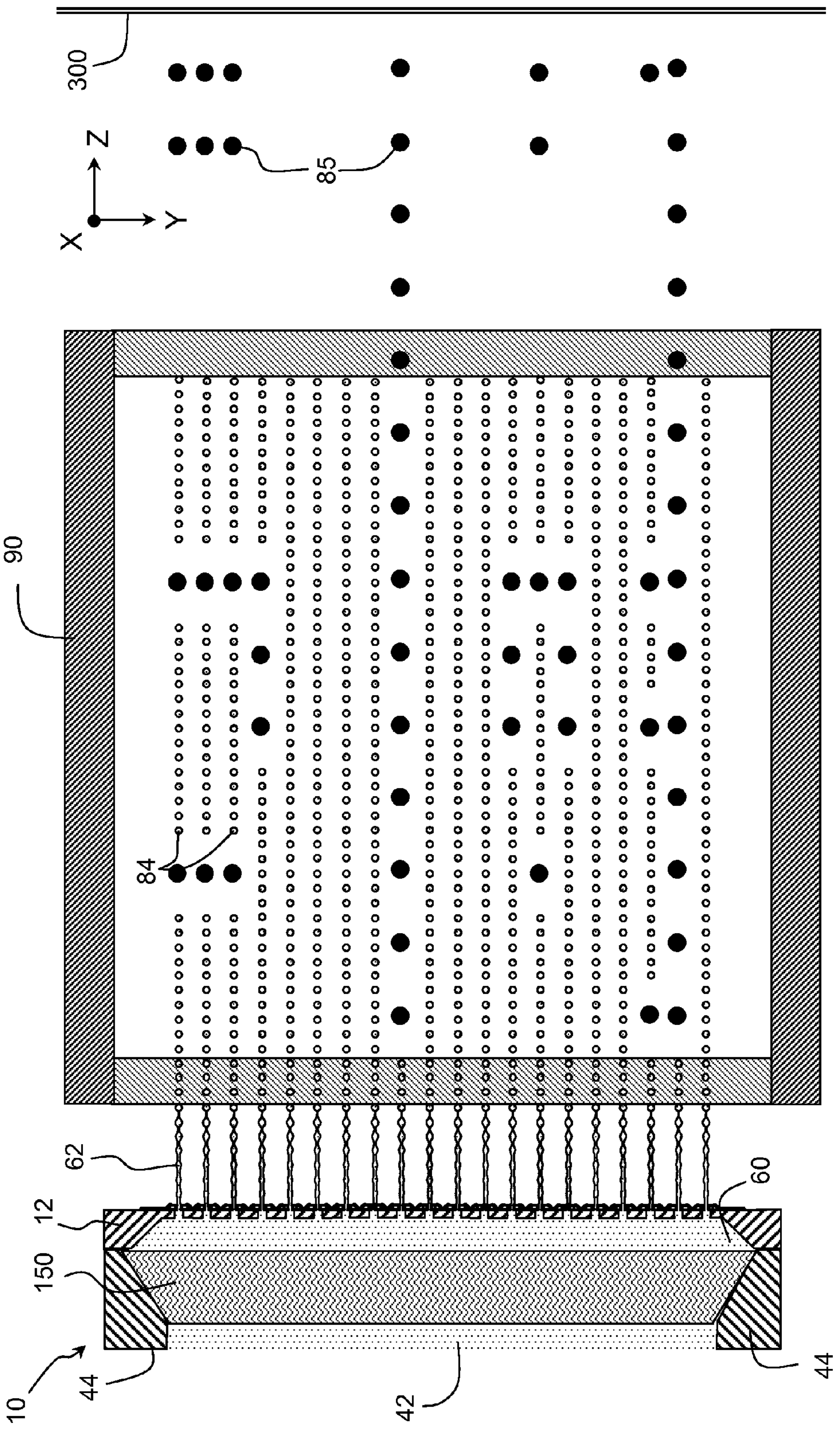
FIG. 5 shows in top plan cross-sectional view a liquid drop emitter operating with large and small drops according to liquid pattern data.

FIG. 5 illustrates in plan cross-sectional view a liquid drop pattern deposition system configured to print with large volume drops 85 and to gutter small volume drops 84 that are subject to deflection airflow in the X-direction, set up by airflow plenum 90. A multiple jet array printhead 10 is comprised of a semiconductor substrate 12 formed with a plurality of jets and jet stimulation transducers attached to a common liquid supply chamber component 44. Patterning liquid 60 is supplied via a liquid supply inlet 42, a slit running the length of the array in the example illustration of FIG. 5. A porous acoustic damping material 150 is placed in the drop generator common liquid supply chamber to absorb acoustic energy produced by the thermal stimulation of each jet, according to the present inventions. The performance of multi-jet drop generator 10 will be discussed below for configurations with and without the incorporation of acoustic damping material in order to explain the present inventions. Note that the large drops 85 in FIG. 5 are shown as "coalesced" throughout, whereas in actual practice the fluid forming the large drops 85 may not coalesce until some distance from the fluid stream break-off point.

Figure 6:
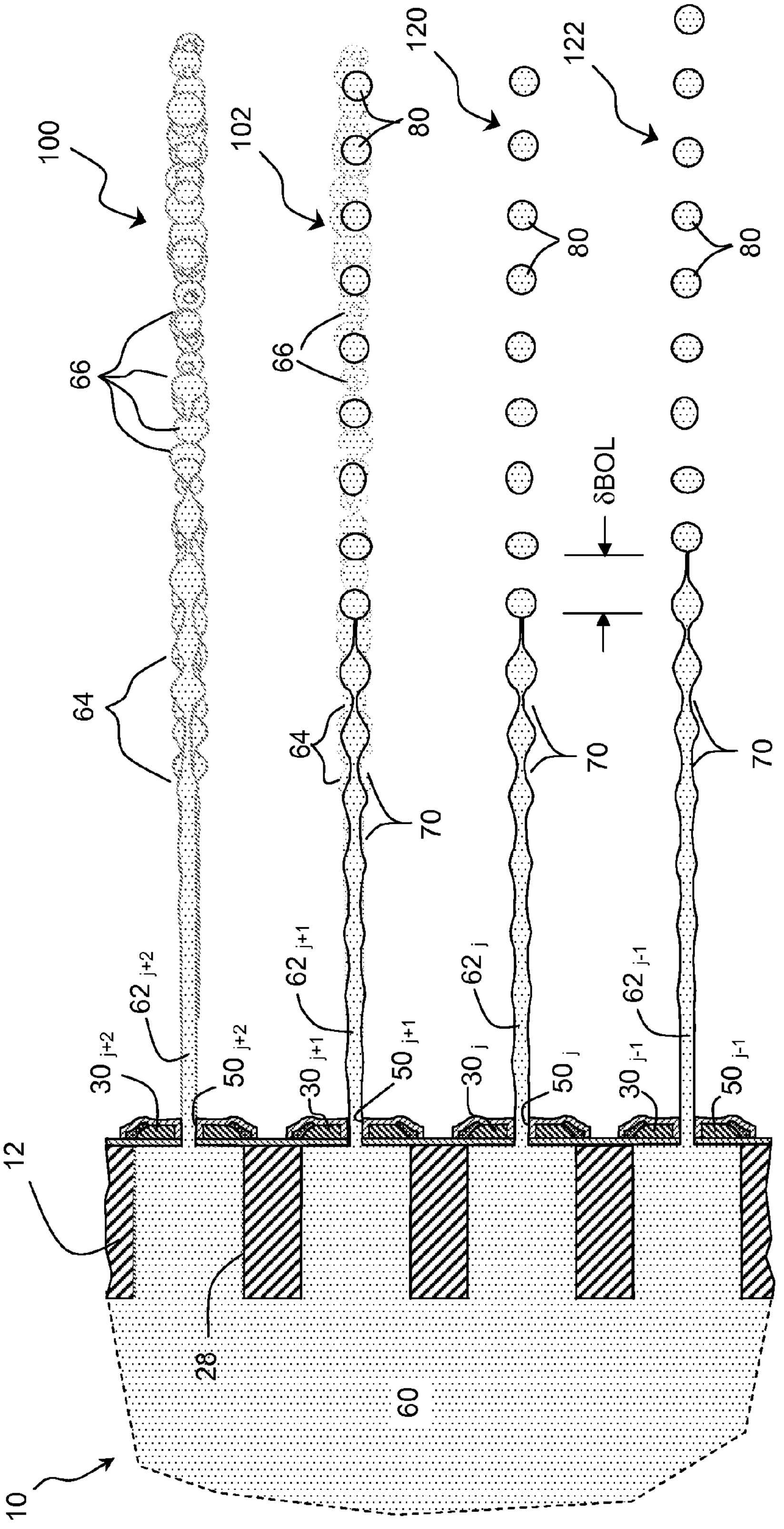
FIG. 6 shows in top plan cross-sectional view a portion of an array of continuous drop emitters illustrating the affect of stimulation crosstalk among nearby jets.
Figure 7:
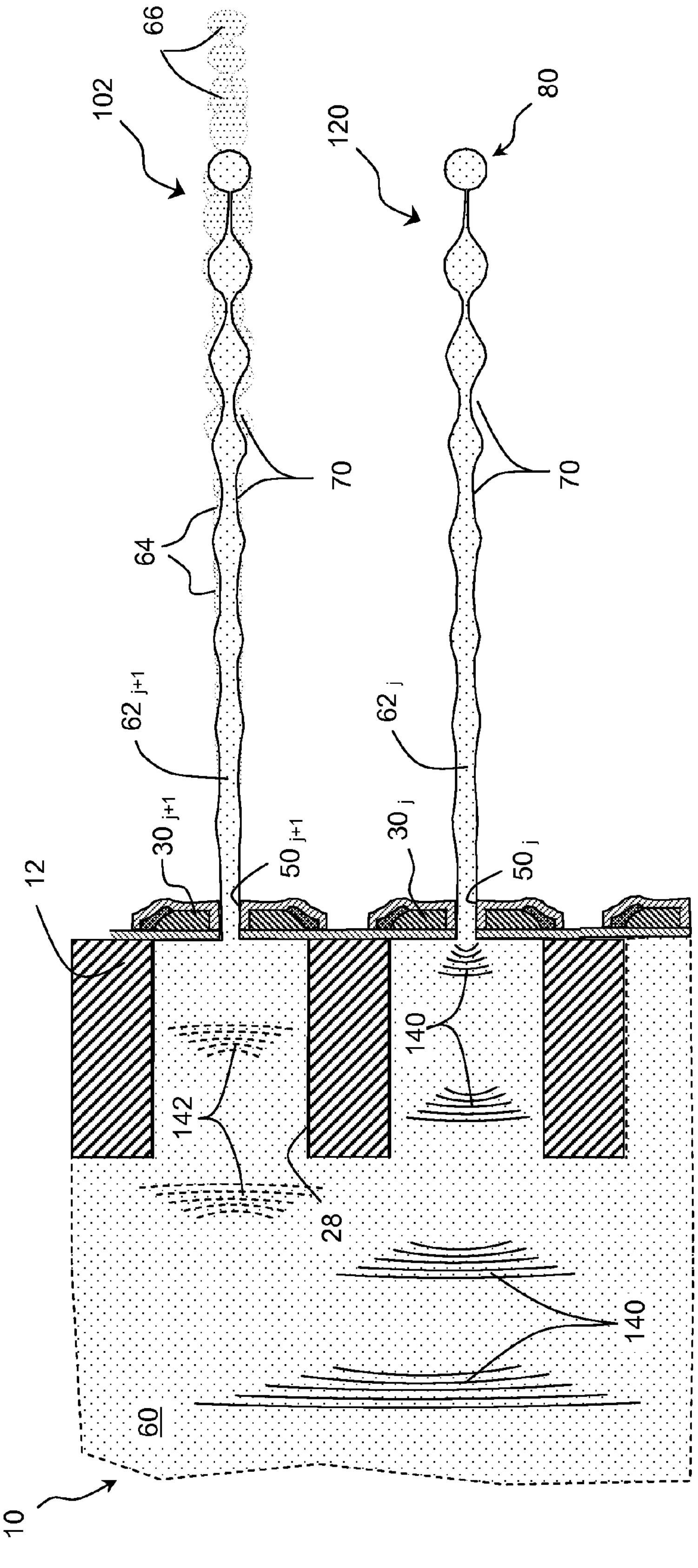
FIG. 7 shows in top plan cross-sectional view two jets of an array of continuous drop emitters illustrating acoustic crosstalk from jet stimulation.

FIG. 6 illustrates in plan cross-sectional view a portion of a multi-jet array including nozzles, streams and heater resistors associated with the $j^{th}$ jet and neighboring jets j+1, j+2 and j−1 along the array (arranged along the Y-direction in FIG. 5). The fluid flow to individual nozzles is partitioned by flow separation features 28, in this case formed as bores in drop generator substrate 12. FIG. 7 illustrates an enlarged view of the two central jets of FIG. 6. The printhead 10 of FIGS. 6 and 7 does not have an acoustic damping material located in the common liquid supply plenum area. Jets $62_j$ and $62_{j-1}$ are being actively stimulated at a baseline stimulation frequency, $f_0$, by applying energy pulses to heater resistors $30_j$ and $30_{j-1}$ as described with respect to FIG. 4(*a*), thereby producing mono-volume drops 80 as was discussed previously.

Jets $62_{j+1}$ and $62_{j+2}$ are not being stimulated by energy pulses to corresponding stimulation resistors $30_{j+1}$ and $30_{j+2}$. Jet $62_{j+2}$ is illustrated as breaking up into drops 66 having a natural dispersion of volumes. However, non-stimulated jet $62_{j+1}$, adjacent stimulated jet $62_j$, is illustrated as exhibiting a mixture of natural and stimulated jet break-up behavior. The inventors of the present inventions have observed such jet break-up behavior using stroboscopic illumination triggered at a multiple of the fundamental stimulation frequency, $f_0$. When reflected acoustic stimulation energy 142 is present arising as "crosstalk" from the acoustic energy 140 produced at a nearby stimulated jet, the affected stream shows a higher proportion of drops being generated at the base drop volume, $V_0$, and drop separation distance, $\lambda_0$, than is the case for totally natural break-up. The stroboscopically illuminated image of a jet breaking up naturally is a blur of superimposed drops of random volumes. When a small amount of acoustic stimulation energy 142 at the fundamental frequency, $f_0$, is added to the fluid flow, because of source acoustic energy 140 propagated in the common supply liquid channels, the image shows a strong stationary ghost image of a stimulated jet superimposed on the blur of the natural break-up. Acoustic stimulation crosstalk also may give rise to differences in break-off length (δ BOL) among stimulated jets as is also illustrated in FIG. 6 as occurring between jets $\mathbf{62}_j$ and $\mathbf{62}_{j-1}$. Acoustic stimulation crosstalk may adversely affect satellite drop formation.

Figure 8:
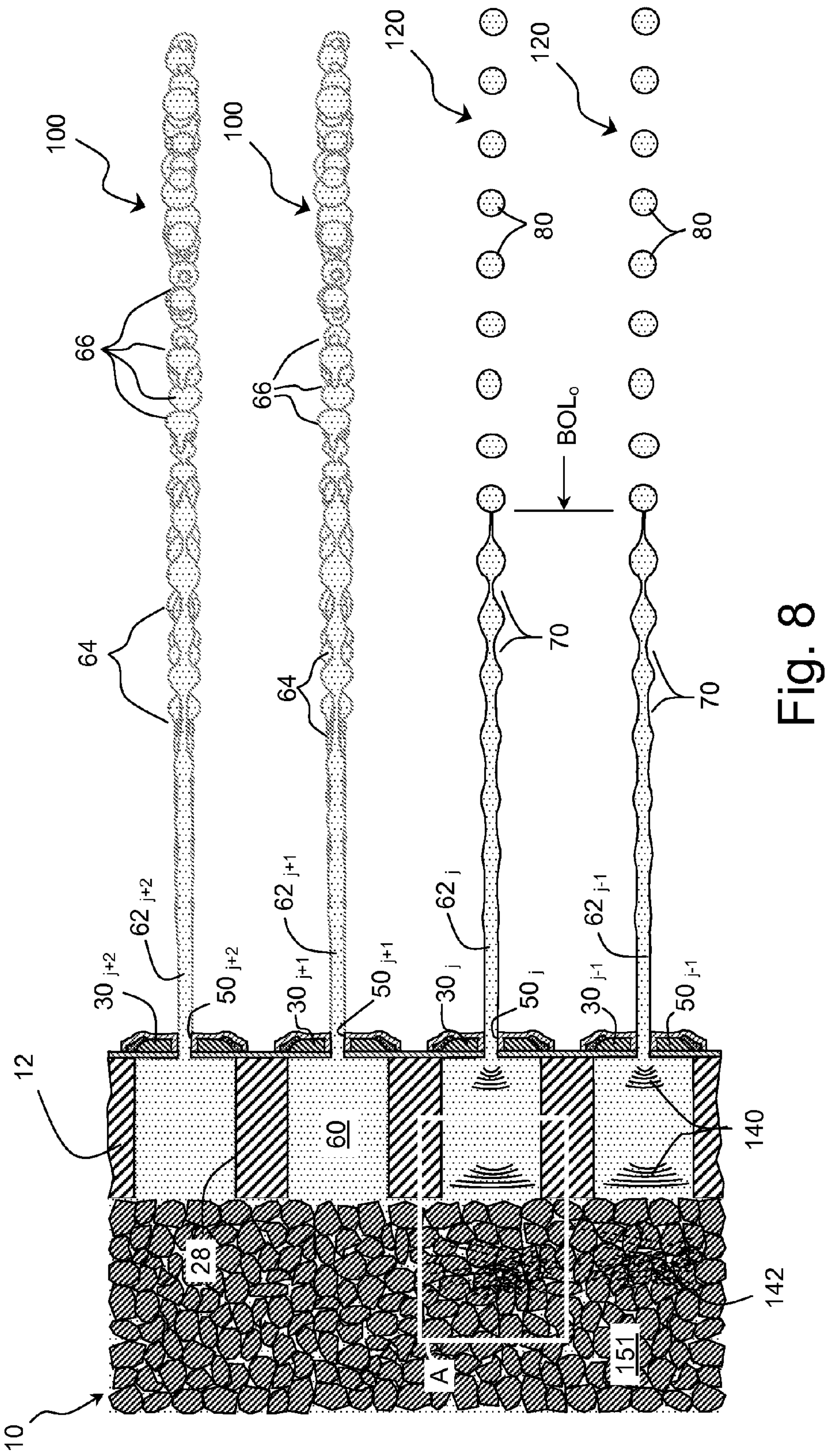
FIG. 8 illustrates in top plan cross-sectional view the crosstalk dampening affect of positioning an acoustic damping material in the common supply chamber.

The inventors of the present inventions have realized that acoustic stimulation crosstalk that propagates in the fluid in regions of common fluid supply chambers may be reduced or eliminated by absorbing the sound energy radiated from the nozzle region using an acoustic damping material. A particular acoustic damping material 151 is illustrated in FIG. 8 in the common liquid supply chamber immediately upstream of flow separation features 28. Radiated source acoustic energy 140 from jets $\mathbf{62}_j$ and $\mathbf{62}_{j-1}$ is absorbed by the acoustic damping material 151, thereby eliminating the stimulation of unstimulated jets $\mathbf{62}_{j+1}$ and $\mathbf{62}_{j+2}$. Absorbing the acoustic crosstalk energy also eliminates the difference in break off lengths between stimulated jets $\mathbf{62}_j$ and $\mathbf{62}_{j-1}$.

Figure 9:
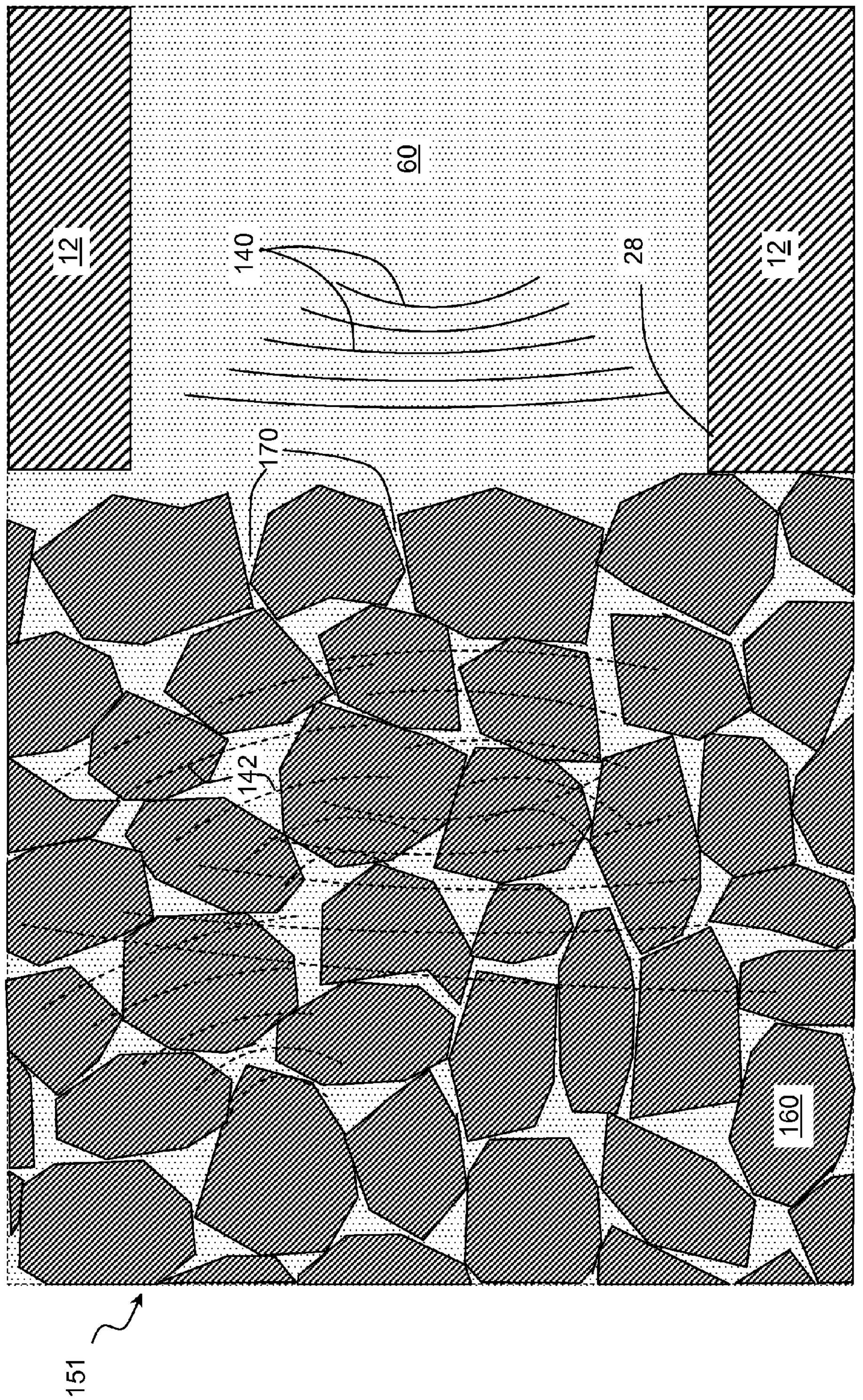
FIG. 9 illustrates an enlarged portion of FIG. 8.

FIG. 9 illustrates an enlarged view of the region "A" of FIG. 8, located in the flow pathway to nozzle $\mathbf{50}_j$, including the place where stimulation generated acoustic energy 140 meets the acoustic damping material 151. The particular acoustic damping material 151 illustrated is a porous matrix comprised of fine passages 170 through which liquid 60 may move and flow and granular particles 160 composed of a material that is substantially denser than the liquid 60. The term "substantially denser" is meant herein to denote a difference of at least 20% and preferably 100% (i.e. a factor of two). Acoustic energy 140 propagates into the liquid from the nozzle region toward the common fluid supply chamber as pressure waves. When the pressure waves 140 encounter acoustic damping material 151, the energy is "absorbed" or "disorganized" largely by two mechanisms, acoustic scattering from dense particles 160, and viscous flow losses as the liquid is moved in fine passages 170 by the acoustic pressure. These phenomena are schematically illustrated by the diminution and multiple reflection wave fronts illustrated by phantom lines 142 representing the reflected acoustic energy. An example porous acoustic damping material 151 of this nature is sintered stainless steel.

The acoustic damping materials chosen for the practice of the present inventions may be drawn from a great variety of material compositions and morphologies. Acoustic damping is generally achieved by the two principle mechanisms noted above, (1) disorganization of the pressure waves via scattering interfaces, and (2) energy transmuted into heat via friction effects. The liquids involved in the majority of continuous jet applications have densities in the range of 1 to 2 gm/cm$^3$. Therefore, sound scattering phenomena can be created by acoustic damping materials incorporating a fine structure of materials having either significantly higher or lower mass density that the liquid being jetted. For the present inventions, the term "significantly higher or lower" means at least a 20% difference in mass density and preferably a 100% (factor of two) difference.

Energy transmutation into heat may be realized by coupling the sound energy to an acoustically lossy material or by arranging for the liquid to be driven into and through fine passages causing viscous damping and energy transmutation into heat. Acoustically lossy materials are generally large molecule polymeric solids having low Young's modulus. When sound energy is transmitted into such materials, the organized pressure wave is dissipated into inelastic molecular vibrations. Both energy transmutation mechanisms are invoked in a fine porous acoustic damping material wherein the matrix is a lossy polymer such as polyurethane.

It should be appreciated that there are many variations of the above principles that may be invoked in designing and choosing acoustic damping materials to absorb and dissipate the acoustic pressure waves injected into the common liquid supply chambers by operating a plurality of stream break-up transducers. FIGS. 10 through 15 illustrate some of the many combinations of the above principles contemplated as useful acoustic damping material configurations by the present inventors.

Figure 10:
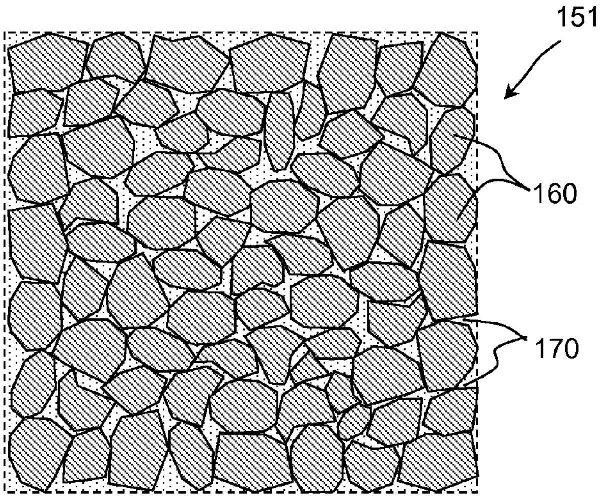
FIG. 10 illustrates a granular porous acoustic damping material according to the present inventions.

FIG. 10 illustrates a porous acoustic damping material 151 having fine passages 170 between granular particles 160 forming a matrix made of one or more materials having significantly higher mass density than the liquid being jetted. The granular morphology is effective in creating many sound reflecting surfaces that cause highly disorganized reflected wave fronts. Materials of significantly higher mass density exhibit sound transmission velocities that are significantly higher than in the liquid. For example, sound velocity in water, at normal temperature and pressure, is ~1482 m/sec. In stainless steel the sound velocity is ~5000 m/sec and in silicon it is ~2200 m/sec. When the sound transmission speed is significantly different across a boundary between two media, the pressure wave is reflected in some proportion to the sound transmission velocity mismatch. Consequently, stainless steel granules are more effective scattering components than would be silicon or silicon dioxide granules. The speed of sound in polyurethane is ~1430 m/sec., close to that of water. Consequently, little wave front scattering will occur at a water/polyurethane interface.

The high mass density material should be chemically compatible with all of the constituent components in the jetted fluid. For example, if the liquid is an ink jet ink for printing images, it may contain water, dyes or pigments, dispersal or solubilizing agents, biocides, humectants, penetrants, uv light blockers, anti-chelating agents and the like. In fact, for the practice of the present inventions it is preferred that any of the acoustic damping materials that come in contact with the working liquid be chosen to have very little chemical activity with respect to any of the constituents of the working fluid.

Examples of materials that might be used as the high mass density matrix particles 160 include stainless steels and inorganic powders such as silicon dioxide, silicon carbide, graphite, tantalum oxide and the like. The morphology of the matrix may be a loose powder or could be sintered to form some connections between particles as long as the porosity is not compromised to the point that the working liquid cannot pass through the material.

The physical morphology of the porous acoustic material illustrated in FIG. 10 could also be implemented using acoustically lossy materials in place of the high mass density particles described. Such an acoustic damping material would operate to transmute the stimulation generated acoustic energy through inelastic molecular motion losses in the matrix material, as well as via viscous flow losses as the liquid is driven in the fine passageways. Lossy particle materials that may be employed include polyterafluoroethylene (PTFE) and various urethanes and other rubbers. Indeed, a porous acoustic damping material may also be formed using both high mass density components for wave front scattering and lossy material components so that all of the above discussed acoustic energy damping mechanisms are employed simultaneously.

Figure 11:
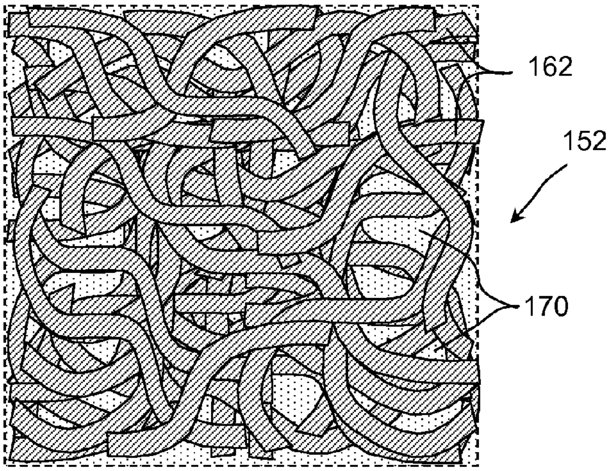
FIG. 11 illustrates a fibrous porous acoustic damping material according to the present inventions.

FIG. 11 illustrates another morphology of a porous acoustic damping material 152 contemplated by the present inventors. The illustrated material 152 operates in analogous fashion to the above discussed material 151 except that the solid matrix phase is formed from a fibrous material 162 instead of granules. Fine passages 170 are created by the interstices between fibers. The fibers 162 may be either high mass density materials such as stainless steel or fiber glass to produce acoustic wave scatter, or a lossy material such as polyethylene to absorb energy by molecular motion, or a combination of the two types of fibrous materials. As stated above, the material selected for fibers 162 is preferably chemically inactive to all constituents of the working fluid.

Figure 12:
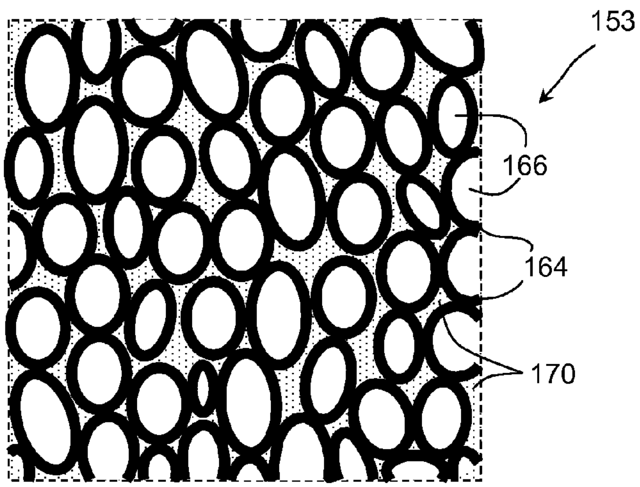
FIG. 12 illustrates a porous acoustic damping material having gas-filled voids according to the present inventions.

FIG. 12 illustrates a porous acoustic damping material 153 that utilizes gas filled voids 166 encapsulated in lossy material shells as scattering elements that form the impervious matrix of the porous structure. The gas-filled voids 166 perform a similar role as the high density granules described with respect to FIG. 10, i.e. they reflect the incoming acoustic pressure wave into incoherent wavelets. The speed of sound in air is ~340 m/sec., substantially mismatched to the 1480 m/sec sound speed in water. Therefore the sound waves will be substantially reflected when the gas-filled voids 166 are encountered.

The shells 164 that encapsulate voids 166 must be strong enough to withstand the operating supply pressure of the working liquid, typically a magnitude of 10 to 80 psi. The interstices 170 between void shells 164 lead to viscous flow losses as the pressure waves squeeze liquid through them. Some acoustic damping may also be generated in the shell material 164. As stated above, the material selected for shells 164 is preferably chemically inactive to all constituents of the working fluid.

Figure 13:
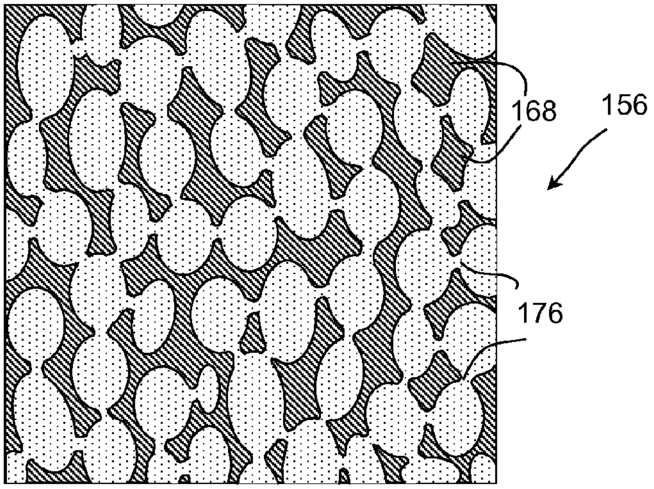
FIG. 13 illustrates a porous acoustic damping material having a lossy matrix material according to a preferred embodiment of the present invention.

FIG. 13 illustrates a porous acoustic damping material 156 formed as an interconnected foam, for example, reticulated polyurethane. The matrix material 168 is an acoustically lossy polymer in which gas bubbles are formed, creating voids. The voids are interconnected 176 either by allowing the bubble forming process to proceed to form such connections or by a secondary step such as crushing (reticulating) the material to break down walls between voids. Such materials are commonly used in drop-on-demand ink jet printer systems for disposable ink supply containers that hold ink at a slight negative pressure by virtue of the pore structure. Used as an acoustic damping material, according to the present inventions, these materials transmute the stimulation generated acoustic energy into heat via viscous losses in the fine passageways 176 and via molecular motion losses in the matrix material 168. As stated above, the material selected for shells 164 is preferably chemically inactive to all constituents of the working fluid.

Figure 14:
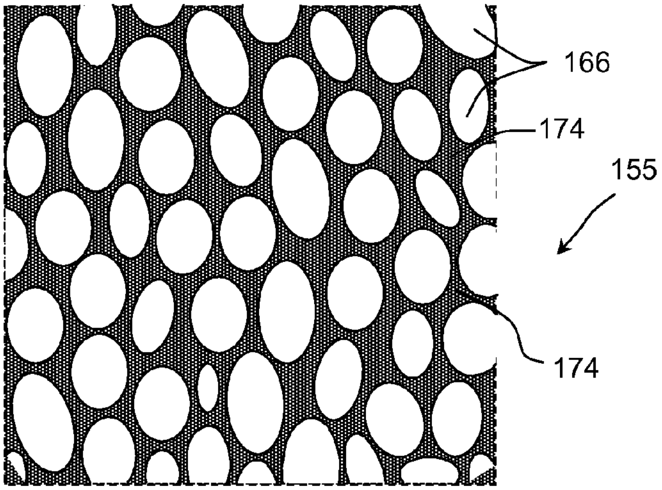
FIG. 14 illustrates a non-porous acoustic damping material having gas-filled voids according to the present inventions.

FIG. 14 illustrates a non-porous acoustic damping material 155 formed as a polymer matrix 174 having included gas-filled voids 166. Such a material may be formed in nearly the same fashion as that illustrated in FIG. 13 except that the bubbles are not allowed to grow together nor is the material purposefully damaged to break down walls between voids. Such an acoustic damping material invokes the molecular motion loss mechanism as initial sound energy is coupled to the matrix material 174 and the wave front scattering mechanism as the stimulation-generated acoustic pressure wave fronts encounter the very low mass gas filled voids 166. Since acoustic damping material 155 is not porous, it is located in the fluid supply chamber adjacent to liquid re-supply pathways but not directly within supply paths as may be the case with the previously discussed porous material embodiments of the present inventions. As stated above, the material selected for matrix material 174 is preferably chemically inactive to all constituents of the working fluid.

Figure 15:
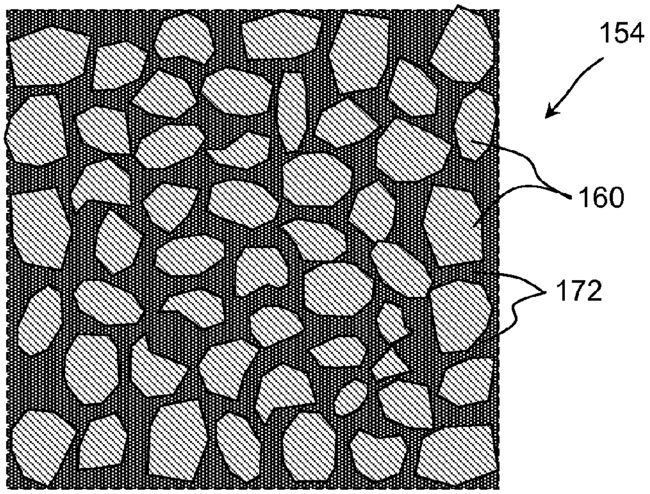
FIG. 15 illustrates a non-porous acoustic damping material having dense material grains according to the present inventions.

FIG. 15 illustrates another non-porous acoustic damping material 154 according to the present inventions. Non-porous acoustic damping material 154 is formed of an acoustically lossy matrix material 172 and high density materials 160 for acoustic wave front scattering. Such an acoustic damping material invokes the molecular motion loss mechanism as sound energy is coupled to the matrix material 172 and the wave front scattering mechanism as the pressure wave fronts encounter the high mass density granules. Since acoustic damping material 154 is not porous, it is located in the fluid supply chamber adjacent to liquid re-supply pathway but not within the supply path as may be the case with the previously discussed porous material embodiments of the present inventions. As stated above, the material selected for matrix material 172 and high mass density scattering material 160 is preferably chemically inactive to all constituents of the working fluid.

It may be appreciated that a material analogous to acoustic damping material 154 may be formed with fibrous high density materials such as those illustrated in FIG. 11. Further a non-porous material could combine both gas filled voids and high density scattering granules or fibers into a single composite material. Furthermore, it is contemplated by the inventors of the present inventions that acoustic damping materials may be provided in layers of different material morphologies or may have compositional changes within a layer that effectively bring to bear the beneficial acoustic damping properties of a porous material and a non-porous material in absorbing stimulation induced acoustic crosstalk in common liquid supply chambers.

Figure 16:
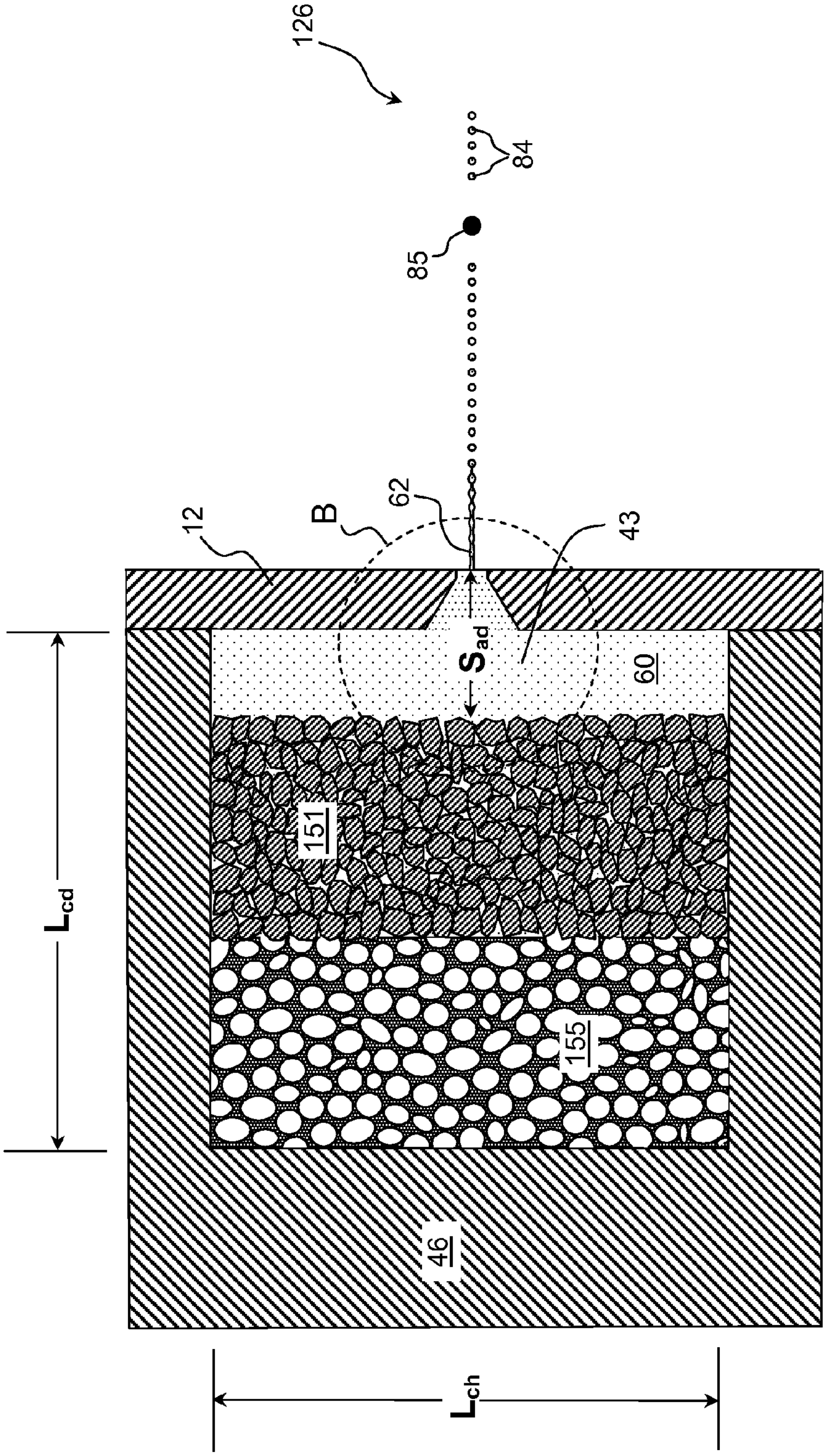
FIG. 16 shows a side cross sectional view of a continuous drop emitter having two types of acoustic damping material in the common liquid supply chamber according to a preferred embodiment of the present invention.

FIG. 16 illustrates in side view cross section a common liquid supply chamber 46 in which two acoustic damping materials have been located to absorb and scatter the stimulation induced crosstalk that may be generated in the chamber 46, a porous acoustic material 151 and a nonporous material 155. Liquid is re-supplied to individual jets from the open chamber space 43 without passing through porous damping material 151. It may be desirable to avoid having to supply the entire flow of jetted liquid to the chamber at the higher pressure that would be required to force all of the supplied liquid through the small interstices of the porous material. Acoustic crosstalk sound energy first couples to the porous acoustic damping material 151. Sound energy that is still propagating is further absorbed and scattered by the non-porous damping material 155. Many other layered combinations of different types of acoustic damping materials may be employed as contemplated by the present inventions.

The porous material 151 is located a "free" propagation distance, $S_{ad}$, away from the thermally stimulated jet 62. That is, any acoustic pressure wave being generated by the stimulation of jet 62 can propagate a distance $S_{ad}$ before the energy absorbing and wave front scattering mechanisms of the acoustic damping materials begin to affect the intensity of the acoustic crosstalk energy in the common liquid supply connecting neighboring jets. For maximum effectiveness it is desirable that the acoustic damping material of the present inventions be located as close as possible just upstream of the point of jet stimulation or, at least, close to the location in the liquid supply pathway where the flow separates to individual jets. It is preferable that the free propagation distance be maintained at least less than one-half the wavelength, $\Lambda_{so}$, of the sound waves generated at the fundamental stimulation frequency, $f_0$; i.e., $S_{ad} \leqq \frac{1}{2}\Lambda_{so} = c_l/f_0$, where $c_l$ is the speed of sound in the liquid at the drop generator operating pressure and temperature. For aqueous inks composed predominately of water with a speed of sound $c_l \sim 1482$ m/sec, the sound wavelengths are $\Lambda_{so} = (1482\text{ m/sec})/f_0 7.41$ mm, for $f_0 = 200$ KHz.

An additional drop generator design element that promotes the absorption of acoustic crosstalk is to provide an adjacent resonant chamber that acts as part of a Helmholtz acoustic resonator tuned to the crosstalk sound frequency most troubling, $f_x$, to drop generator performance, for example the fundamental stimulation frequency, $f_0$. The most troubling frequency, $f_x$, however, may be a frequency lower than the fundamental frequency, $f_0$, for liquid pattern printing systems generating predetermined drops of multiple unit volumes, $mV_0$, as discussed above with respect to FIGS. 4 and 5. That is, when the stimulation means are pulsed less frequently to allow large drop volumes to be created (see FIG. 4), the disruptive acoustic crosstalk frequencies generated may be at lower integer divisions of the fundamental, i.e., $f_x \sim f_0/m$. Finally, the most troubling acoustic crosstalk frequency may be a frequency higher than the fundamental, for example the second harmonic frequency, $2_0$, the intensity of which may cause adverse satellite formation behavior due to second harmonic acoustic crosstalk. Consequently, the Helmholtz resonator is tuned to a selected crosstalk frequency, $f_x$, preferably within the range: $f_0/10 \leqq f_x \leqq 2f_0$.

Rectangular cross-sectional chamber 46 in FIG. 16, a portion 43 of which also serves as a common fluid supply reservoir, may be designed to serve as the resonant chamber of a Helmholtz acoustic resonator of frequency $f_x$ by proper choice of the chamber depth, $L_{cd}$, and chamber height, $L_{ch}$.

Acoustic Helmholtz resonators are used as physical notch filters in acoustic transmission systems wherein it is desirable to remove a particular narrow band of sound. A resonant chamber is connected to the region of sound propagation by an inlet neck portion. Sound that propagates through the neck region is "trapped" in the resonant chamber by reflections. If acoustic damping material is placed within the resonant chamber the trapped sound is further dissipated by transmutation into heat energy. For the case of a continuous drop generator, the common fluid supply chamber that is most immediately adjacent the point of flow separation to the plurality of nozzles is an effective location for the Helmholtz resonant chamber whether or not this chamber is fully, partially or not at all filled with the liquid for common supply purposes.

The dimensions of the Helmholtz resonator chamber may be readily determined experimentally. That is, chamber dimensions over an appropriate range may be adjusted until the maximum notch filtering effect is detected, perhaps by observing the break-up behavior of non-stimulated jets that are adjacent to stimulated jets or the volumes of selected drops of intended multiples of the unit drop volume.

For the purposes of understanding the present inventions, the drop generator chamber 46 illustrated in cross-sectional view in FIG. 16 may be considered as extending in the third dimension along the nozzle array forming a rectilinear cavity having the same cross-section along its length. The inlet necking region 48 leading to the rectangular chamber, noted as the region "B" in FIG. 16, is shown in expanded view in FIG. 17. Inlet neck region 48 is also extended in the array direction forming a necking region having a largely triangular cross section. The Helmholtz resonant frequency, $f_h$, is related to the two-dimensional Helmholtz chamber area, $A_h$, the speed of sound in the material filling the Helmholtz chamber, $c_h$, the effective width of the inlet neck, $W_n$, and the length of the inlet neck, $L_n$. The first order relationship among these variables is as follows:

$$A_h = \frac{c_h^2 W_n}{4\pi^2 f_h^2 L_n}. \quad (1)$$

To design a Helmholtz resonant cavity to filter and absorb the most troublesome acoustic cross talk frequency, $f_x$, this frequency is set equal to $f_h$ in Equation 1.

Figure 17:
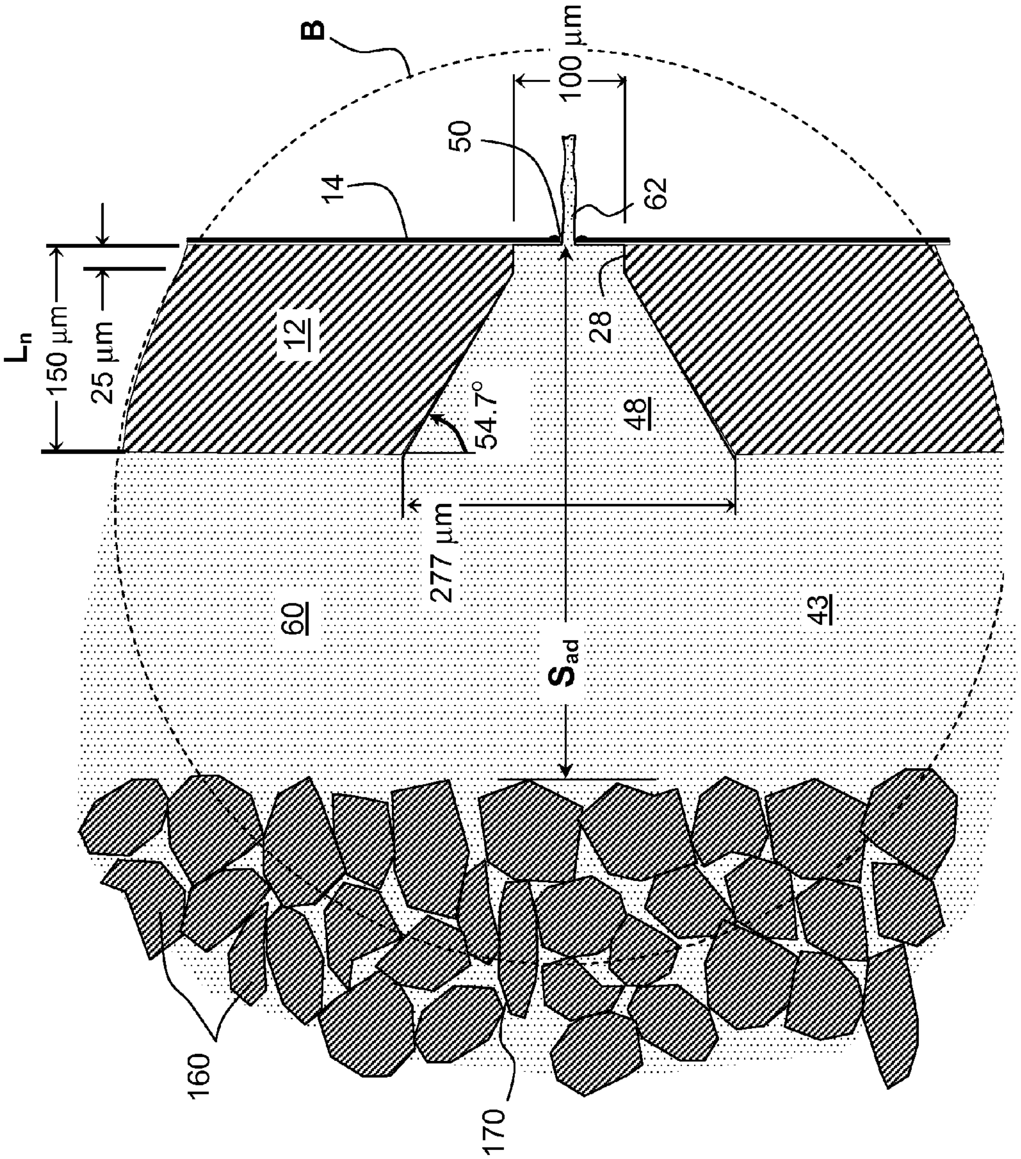
FIG. 17 illustrates an enlarged portion of FIG. 16.

Some example dimensions for an inlet necking region are given in FIG. 17. A silicon substrate 12 on which the nozzles, stimulation heaters and pulse driving transistors are formed is thinned to 150 microns. Flow separation bores 28, 100 microns in diameter, are formed 25 microns deep at which point they join a common array wide fluid supply trench formed by orientation dependent etching (ODE), giving it a characteristic triangular shape. For this example the neck length, $L_n$=150 microns. The effective or average neck width, $W_n$, is calculated from the total cross-sectional neck area, $A_n$, divided by the neck length, $L_n$, i.e. $W_n = A_n/L_n \sim 174$ microns for the example ODE-formed inlet neck illustrated in FIG. 17. Assuming the above parameters together with $c_h$=1500 m/sec (water-filled) and $f_h$=200 KHz, the resonant Helmholtz cavity cross sectional area, $A_h$, is 0.0248 $cm^2$.

Figure 18:
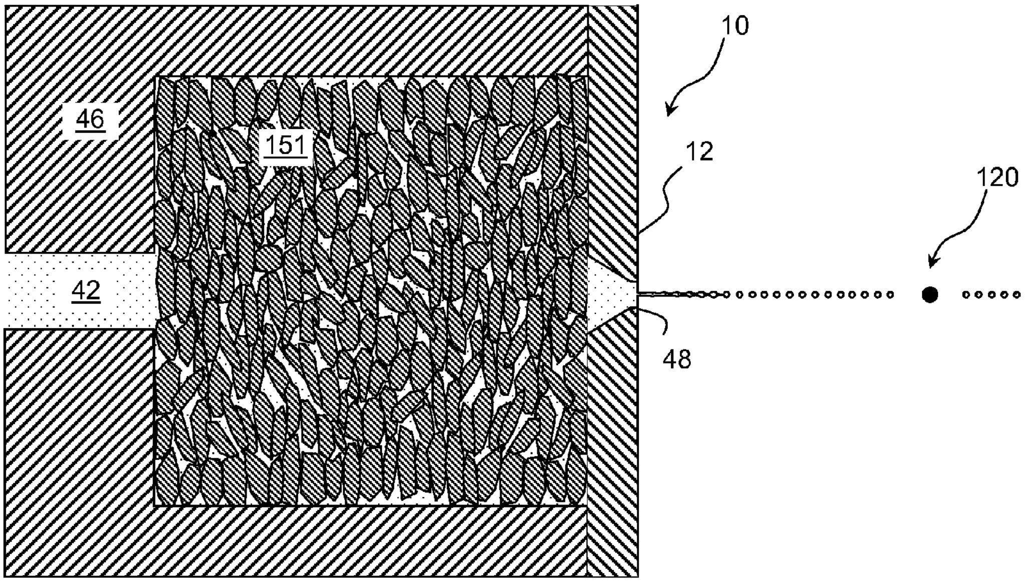
FIG. 18 shows a side cross sectional view of a continuous drop emitter wherein the common liquid supply chamber is configured as a Helmholtz resonator according to a preferred embodiment of the present invention.
Figure 19:
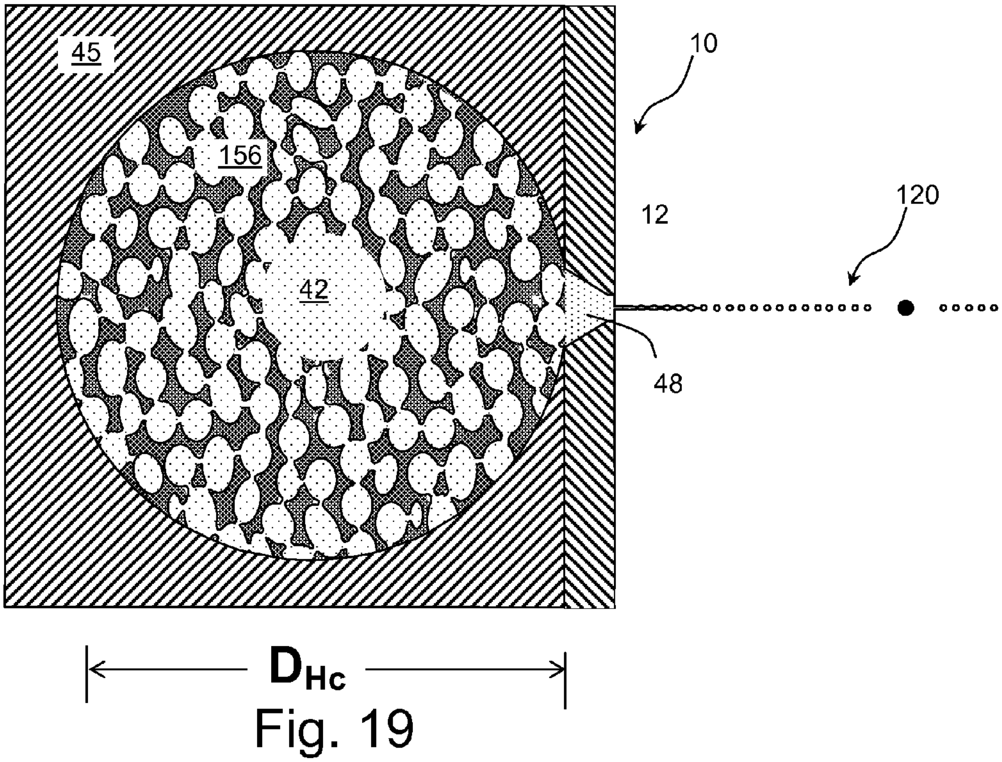
FIG. 19 shows a side cross sectional view of a continuous drop emitter wherein the common liquid supply chamber is configured as a Helmholtz resonator according to another preferred embodiment of the present inventions.

FIGS. 18 and 19 illustrate two common fluid supply chambers 46 and 45 respectively, dimensioned to resonate at 200 KHz when filled with water ($c_h$=1500 m/sec) and having the neck inlet dimensions given in FIG. 17. The square cross-section fluid supply chamber 46 illustrated in FIG. 18 is filled with acoustic damping material 151, previously discussed. The chamber height, $L_{ch}$, and chamber depth, $L_{cd}$, are both ~1575 microns. The circular cross-sectional area fluid supply chamber 45 illustrated in FIG. 19 has a diameter of 1775 microns for $c_h$=1500 m/sec as well. Common supply chamber 45 is filled with above discussed porous acoustic damping material 156. Two different supply fluid inlet 42 positions are illustrated for the two different fluid supply chamber designs. For the circular bore chamber, high pressure liquid 60 is fed into the center of porous acoustic damping material 156.

Figure 20:
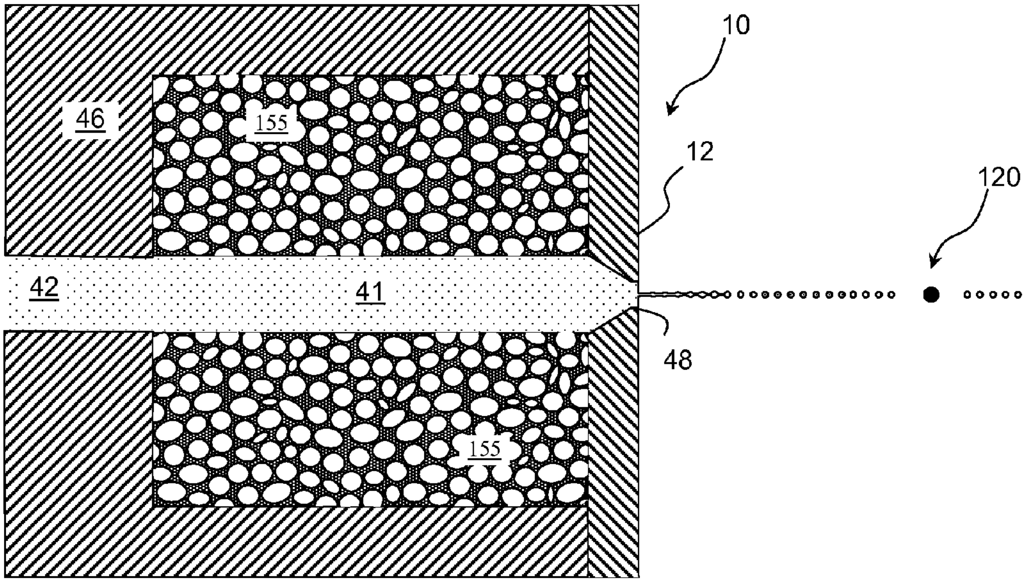
FIG. 20 shows a side cross sectional view of a continuous drop emitter having a non-porous acoustic damping material positioned adjacent a common fluid supply pathway according to a preferred embodiment of the present invention.

FIG. 20 illustrates a common fluid supply chamber 46 dimensioned to resonate at 200 KHz when filled with water ($c_h$=1500 m/sec) and having the neck inlet dimensions given in FIG. 17. The square cross-section fluid supply chamber 46 illustrated in FIG. 20 is substantially filled with a non-porous acoustic damping material 155, previously discussed. The nonporous acoustic damping material is adjacent a common fluid supply pathway 41 through which high pressure liquid 60 is supplied. Acoustic crosstalk sound energy that propagates into the common fluid supply pathway 41 is coupled to and absorbed and scattered by the non-porous damping material 155. The chamber height, $L_{ch}$, and chamber depth, $L_{cd}$, are both ~1575 microns.

In practice, Equation 1 relating the geometrical parameters of the Helmholtz resonator structure to fluid properties and resonant frequency is best viewed as an approximation given the several other features (supply inlet, acoustic damping material type and placement, et cetera) that may affect the center and bandwidth of the resonant filter effect. An acoustic damping material having gas-filled voids will result in a lower effective sound velocity in the Helmholtz cavity and a fill having high mass density components will result in an increased effective sound velocity. It is suggested that an iterative experimental procedure will achieve the most effective Helmholtz chamber design for a particular working liquid and acoustic damping material choices.

The inventors of the present inventions further contemplate that a Helmholtz resonant cavity having a nonporous acoustic damping material may be designed in similar fashion to those structures illustrated in FIGS. 16 through 19, except that the supply fluid inlet 42 would be routed into the triangular neck region 42 from one or both ends of the array of nozzles rather than through the resonant cavity 46 or 45.

The inventions have been described in detail with particular reference to certain preferred embodiments thereof, but it will be understood that variations and modifications can be effected within the spirit and scope of the inventions.

| PARTS LIST | |
|---|---|
| 10 | continuous liquid drop emission printhead |
| 12 | drop generator substrate |
| 14 | drop nozzle front face layer |
| 16 | passivation layer |
| 20 | via contact to power transistor |
| 22 | printhead electrical connector |
| 24 | individual transistor per jet to power heat pulses |
| 30 | thermal stimulation heater resistor surrounding nozzle |
| 36 | address lead to heater resistor |
| 36 | common heater address electrode |
| 38 | nozzle address lead |
| 39 | stimulation heater address electrode |
| 40 | pressurized liquid supply |
| 41 | common liquid supply pathway |
| 42 | pressurized liquid supply inlet |
| 43 | open liquid portion of a common liquid supply chamber |
| 44 | common liquid supply chamber |
| 45 | circular cross-section Helmholtz resonant liquid supply chamber |
| 46 | square cross-section Helmholtz resonant liquid supply chamber |
| 47 | Helmholtz resonant chamber |
| 48 | common liquid supply chamber formed in drop generator substrate |
| | an inlet necking region of a Helmholtz resonator configuration |
| 50 | nozzle opening with effective diameter $D_{dn}$ |
| 60 | positively pressurized liquid |
| 62 | continuous stream of liquid |
| 64 | natural sinuate surface necking on the continuous stream of liquid |
| 66 | drops of undetermined volume |
| 70 | stimulated sinuate surface necking on the continuous stream of liquid |
| 72 | natural (unstimulated) break-off length |
| 74 | operating break-off length due to controlled stimulation |
| 80 | drops of predetermined volume |
| 82 | undeflected drops following nominal flight path to medium |
| 84 | drops of small volume, $\sim V_0$, unitary volume drop |
| 85 | large volume drops having volume $\sim 5\ V_0$ |
| 86 | large volume drops having volume $\sim 4\ V_0$ |
| 87 | large volume drops having volume $\sim 3\ V_0$ |
| 88 | large volume drops having volume $\sim 8\ V_0$ |
| 90 | airflow plenum for drop deflection (towards the X-direction) |
| 99 | negative pressure source inlet |
| 100 | stream of drops of undetermined volume from natural break-up |
| 102 | stream of drops of undetermined volume from natural break-up mixed with some drops of pre-determined volume due to acoustic crosstalk |
| 120 | stream of drops of pre-determined volume with one level of stimulation |
| 122 | stream of drops of pre-determined volume with one level of stimulation |
| 140 | sound waves generated in the fluid by jet stimulation |
| 142 | reflected or scattered sound waves causing inter-jet stimulation (crosstalk) |
| 150 | acoustic damping material |
| 151 | porous acoustic damping material having high density granular material |
| 152 | porous acoustic damping material having fibrous material matrix |
| 153 | porous acoustic damping material having gas-filled cells |
| 154 | acoustic damping material with high density grains in lossy matrix material |
| 155 | acoustic damping material with gas-filled cells in lossy matrix material |
| 156 | porous acoustic damping material having lossy matrix material |
| 160 | high density acoustic scattering material |
| 162 | fibrous material may be either high density, lossy or a combination |
| 164 | strong shell walls encapsulating gas bubbles |
| 166 | gas-filled voids |
| 168 | lossy matrix material with interconnecting void structure |
| 170 | fine fluid passages within porous matrix material |
| 176 | connections between voids allowing interconnected fluid flow |
| 245 | connection to liquid recycling unit |
| 250 | media transport input drive means |
| 252 | media transport output drive means |
| 300 | print or deposition plane |
| 400 | controller |
| 410 | input data source |
| 412 | printhead transducer drive circuitry |
| 414 | media transport control circuitry |

-continued

| PARTS LIST | |
|---|---|
| 416 | liquid recycling subsystem including vacuum source |
| 418 | liquid supply reservoir |
| 420 | negative pressure source |
| 422 | air subsystem control circuitry |
| 424 | liquid supply subsystem control circuitry |
| 610 | unit period, $\tau_0$, pulses |
| 612 | a $4\tau_0$ time period sequence producing drops of volume $\sim 4\ V_0$ |
| 615 | an $8\tau_0$ time period sequence producing drops of volume $\sim 8\ V_0$ |
| 616 | a $3\tau_0$ time period sequence producing drops of volume $\sim 3\ V_0$ |

The invention claimed is:

1. A continuous drop emitter comprising:

a liquid supply chamber containing a liquid held at a positive pressure;

first and second nozzles in fluid communication with the liquid supply chamber emitting first and second continuous streams of a liquid;

first and second stream break-up transducers adapted to independently synchronize the break up of the first and second continuous streams of the liquid into first and second streams of drops, respectively, at a same nominal drop frequency, $f_0$, also generating sound waves in the liquid at the nominal drop frequency, $f_0$;

a Helmholtz resonator tuned to a selected acoustic crosstalk frequency, $f_x$, wherein $(f_0/10) \leqq f_x \leqq 2f_0$ and the Helmholtz resonator is comprised of a resonant volume chamber and at least one resonator coupling passageway in acoustic communication with the liquid supply chamber; and an acoustic damping material located within the Helmholtz resonator for damping sound waves generated within the liquid chamber by the first and second stream break-up transducers.

2. The continuous drop emitter of claim 1 wherein at least a portion of the resonant volume chamber is comprised of the fluid supply chamber and the at least one resonator coupling passageway is in fluid communication with the first and second nozzles.

3. The continuous drop emitter of claim 1 wherein at least a portion of the resonant volume chamber is filled with a porous acoustic damping material.

4. The continuous drop emitter of claim 1 wherein at least a portion of the resonant volume chamber is filled with an acoustically lossy material wherein sound waves lose energy while propagating in the acoustic damping material at a significantly higher spatial rate than when propagating in the liquid.

5. The continuous drop emitter of claim 3 wherein the speed of sound in the liquid is a first sound speed, the porous material is comprised of an acoustic scattering material having a second sound speed, and the second sound speed is substantially higher or substantially lower than the first sound speed.

6. The continuous drop emitter of claim 1 wherein the first and second stream break-up transducers are resistive heater apparatus adapted to heat the continuous liquid stream emitted from the first and second nozzles, respectively and independently.

7. The continuous drop emitter of claim 1 wherein the liquid is composed of a plurality of constituents and the acoustic damping material is chemically inactive in contact with each of the plurality of constituents.

* * * * *